United States Patent
Miyashita

(10) Patent No.: US 8,957,375 B2
(45) Date of Patent: Feb. 17, 2015

(54) INFRARED DETECTING ELEMENT, METHOD FOR MANUFACTURING INFRARED DETECTING ELEMENT, AND ELECTRONIC DEVICE

(75) Inventor: Kazuyuki Miyashita, Nagano (JP)

(73) Assignee: Seiko Epson Corporation, Tokyo (JP)

(*) Notice: Subject to any disclaimer, the term of this patent is extended or adjusted under 35 U.S.C. 154(b) by 341 days.

(21) Appl. No.: 13/601,274

(22) Filed: Aug. 31, 2012

(65) Prior Publication Data
US 2013/0056637 A1    Mar. 7, 2013

(30) Foreign Application Priority Data
Sep. 7, 2011 (JP) ................................ 2011-194658

(51) Int. Cl.
| | | |
|---|---|---|
| G01J 5/34 | (2006.01) | |
| G01J 5/24 | (2006.01) | |
| G01J 5/02 | (2006.01) | |
| G01J 5/08 | (2006.01) | |
| H01L 37/02 | (2006.01) | |
| G01J 5/00 | (2006.01) | |

(52) U.S. Cl.
CPC .. *G01J 5/024* (2013.01); *G01J 5/34* (2013.01); *G01J 5/0025* (2013.01)
USPC ...................................................... 250/338.3

(58) Field of Classification Search
USPC ...................................................... 250/338.3
See application file for complete search history.

(56) References Cited

U.S. PATENT DOCUMENTS

| | | | |
|---|---|---|---|
| 6,590,710 B2 | 7/2003 | Hara et al. | |
| 7,557,349 B2 | 7/2009 | Oda et al. | |
| 8,618,483 B2 * | 12/2013 | Kurashina et al. | ......... 250/338.3 |
| 8,734,010 B2 * | 5/2014 | Tsuchiya | ...................... 374/121 |
| 2002/0040967 A1* | 4/2002 | Oda | ........................... 250/338.1 |
| 2004/0089807 A1* | 5/2004 | Wada et al. | ................. 250/338.1 |
| 2004/0232337 A1* | 11/2004 | Vilain | ........................ 250/338.1 |
| 2004/0232503 A1* | 11/2004 | Sato et al. | ..................... 257/417 |
| 2009/0207879 A1 | 8/2009 | Kurashina | |
| 2011/0019202 A1 | 1/2011 | Iwaki et al. | |
| 2011/0180711 A1* | 7/2011 | Tsuchiya | ................... 250/338.4 |
| 2011/0182320 A1* | 7/2011 | Noda | ............................ 374/121 |
| 2011/0235676 A1 | 9/2011 | Noda et al. | |

FOREIGN PATENT DOCUMENTS

| | | | |
|---|---|---|---|
| JP | 2002-174721 A | 6/2002 | |
| JP | 2008-241439 A | 10/2008 | |
| JP | 2009-192350 A | 8/2009 | |
| JP | 2011-027780 A | 2/2011 | |
| JP | 2011-203169 A | 10/2011 | |

* cited by examiner

*Primary Examiner* — Christine Sung
(74) *Attorney, Agent, or Firm* — Global IP Counselors, LLP

(57) ABSTRACT

The infrared detecting element has a base plate; an insulating film that is provided on the base plate and has a recessed portion surrounding a hollow space; a supporting section that is held by a beam, one end of the beam being fixed to the insulating film, and is located in an area that opposes the hollow space; and an infrared detecting section that is provided on the supporting section and detects infrared rays, in which the recessed portion is covered with a water repellent film that includes polysilicon, and the beam and the supporting section include silicon nitride or silicon carbonitride.

5 Claims, 14 Drawing Sheets

INFRARED DETECTING ELEMENT, METHOD FOR MANUFACTURING INFRARED DETECTING ELEMENT, AND ELECTRONIC DEVICE

CROSS-REFERENCE TO RELATED APPLICATIONS

This application claims priority to Japanese Patent Application No. 2011-194658 filed on Sep. 7, 2011. The entire disclosure of Japanese Patent Application No. 2011-194658 is hereby incorporated herein by reference.

BACKGROUND

1. Technical Field

The present invention relates to an infrared detecting element, and particularly relates to an element that detects an irradiation amount of infrared rays.

2. Background Technology

Research has been made on an infrared detecting element using a micromachining technology to a silicon base plate. One of the infrared detecting elements is a bolometer-type infrared detecting element that detects change in the temperature due to infrared rays. The infrared detecting element can detect infrared rays with good sensitivity by using an insulation structure that will not release heat after the infrared detecting element is heated by infrared rays.

Patent Document 1 has disclosed a bolometer-type infrared detecting element in which a detecting section is provided in an area spaced apart from a silicon base plate. According to this document, a sacrifice layer is formed of diamond-like carbon, and a supporting section and a detecting section are formed on the sacrifice layer. Then, etching is conducted to the sacrifice layer by plasma processing including oxygen so as to form a hollow space. In this manner, the detecting section has an insulation structure. However, the detecting section is exposed to a condition of being heated for a long period of time, and exposed to a circumstance of plasma discharge for a long period of time. Consequently, the detecting section is more likely to be damaged.

If a wet process is used at the time of etching the sacrifice layer, it is possible to prevent the detecting section from being exposed to heat or plasma for a long period of time. As such a method, the following can be possible. First, a recessed portion is formed, and a protective film for protection against an etching solution is formed on the surface of the recessed portion. Next, a sacrifice layer is formed on the recessed portion, and a supporting section and a detecting section are provided on the sacrifice layer. Subsequently, the sacrifice layer is removed by being immersed in an etching solution. The etching solution is also referred to as an etchant.

Japanese Laid-open Patent Application No. 2009-192350 (Patent Document 1) is an example of the related art.

SUMMARY

Problems to be Solved by the Invention

After the sacrifice layer is removed, a base plate is immersed in pure water and the etching solution is discharged from the recessed portion. Next, the pure water is discharged from the recessed portion. The supporting section is located in an area that opposes the recessed portion. When the pure water is gradually discharged, the supporting section sticks to the bottom of the recessed portion because the surface tension of the pure water acts on the supporting section. This phenomenon is called as sticking. In this instance, the supporting section and a beam that supports the supporting section are deformed. Further, since the supporting section contacts the recessed portion, heat of the detecting section is transferred to the recessed portion, which results in deterioration in the infrared detection sensitivity. Accordingly, an infrared detecting element has been desired in which the supporting section can be prevented from sticking to the bottom of the recessed portion.

The invention has been made to address at least part of the above-described circumstances, and the invention can be achieved as embodiments or application examples described below.

Means Used to Solve the Above-Mentioned Problems

Application Example 1

An infrared detecting element of this application example has a base plate; an insulating film that is provided on the base plate and has a recessed portion; a supporting section that is held by a beam, one end of the beam being fixed to the insulating film, and is located above the recessed portion such that a hollow space stands between the supporting section and the recessed portion; and an infrared detecting section that is provided on the supporting section and detects infrared rays, in which the recessed portion is covered with a water repellent film that includes polysilicon, and the beam and the supporting section include silicon nitride or silicon carbonitride.

According to this application example, the insulating film is provided on the base plate, and the insulating film has the recessed portion. The supporting section is located in an area that opposes the recessed portion such that a hollow space stands between the supporting section and the recessed portion, and the supporting section is supported by the beam one end of which is fixed to the insulating film. The infrared detecting section is provided on the supporting section, and the infrared detecting section detects infrared rays. When the infrared detecting section and the supporting section are irradiated by infrared rays, the infrared detecting section is heated and its temperature increases. The infrared detecting section detects an irradiation amount of infrared rays by detecting the temperature change of the infrared detecting section. Since the heat amount heated by infrared rays in the infrared detecting section and the supporting section is insulated by the hollow space, the infrared detecting section can detect an irradiation amount of infrared rays with good sensitivity.

In a process of forming the hollow space in the recessed portion, the base plate is cleaned by pure water. When the pure water is discharged from the recessed portion, the surface tension of the pure water acts, which causes the recessed portion and the supporting section to easily stick to the each other. The recessed portion is covered with a water repellent film of polysilicon. Since the water repellent film of polysilicon has water repellent properties, the pure water is easily discharged from the recessed portion. Further, the beam and the supporting section include silicon nitride or silicon carbonitride. Silicon nitride and silicon carbonitride are a material that has high rigidity compared to silicon and silicon oxide. It is thus possible to prevent the supporting section from sticking to the bottom of the recessed portion when the pure water is discharged from the recessed portion.

Application Example 2

In the infrared detecting element according to the above-described application example, the infrared detecting section has a lower electrode, a pyroelectric body, and an upper electrode that are provided and layered on the supporting section; the supporting section includes silicon nitride; and the pyroelectric body has a preferred orientation.

According to this application example, the infrared detecting section has the lower electrode, the pyroelectric body, and the upper electrode that are provided and layered on the supporting section. The pyroelectric body has a preferred orientation. Thus, infrared rays can be detected with good sensitivity. The lower electrode is provided on the supporting section that includes silicon nitride. Since the surface roughness can be made small when a film of silicon nitride is formed, the lower electrode can be provided on the flat supporting section. Consequently, the lower electrode can accurately be formed, and a preferred orientation can be achieved in the pyroelectric body. As a result, the sensitivity of the infrared detecting element can further be improved.

Application Example 3

A method for manufacturing an infrared detecting element according to this application example has an insulating film forming process for forming an insulating film on a base plate; a recessed portion forming process for forming a recessed portion in the insulating film; a water repellent film forming process for forming a water repellent film so as to cover the recessed portion; a sacrifice film forming process for forming a sacrifice film on the recessed portion; a supporting member forming process for film-forming a supporting member on the sacrifice film; a detecting section forming process for forming an infrared detecting section on the supporting member; a supporting section forming process for patterning the supporting member into shapes of a supporting section that supports the infrared detecting section and a beam that holds the supporting section; and an etching process for conducting etching to the sacrifice film. The water repellent film includes polysilicon, and the supporting member includes silicon nitride or silicon carbonitride.

According to this application example, the insulating film is formed on the base plate in the insulating film forming process. Next, the recessed portion is formed in the insulating film in the recessed portion forming process. The water repellent film is formed so as to cover the recessed portion in the water repellent film forming process. The sacrifice film is formed on the recessed portion in the sacrifice film forming process. The supporting member is film-formed on the sacrifice film in the supporting member forming process. The infrared detecting section is formed on the supporting member in the detecting section forming process. The supporting member is patterned into shapes of the supporting section and the beam in the supporting section forming process. Etching is conducted to the sacrifice film to remove the sacrifice film in the etching process. In this manner, the hollow space is formed in an area of the recessed portion where the sacrifice film used to exist, and the supporting section is located in an area that opposes the recessed portion. When the infrared detecting section and the supporting section are irradiated by infrared rays, the infrared detecting section detects an irradiation amount of infrared rays by detecting the temperature change of the infrared detecting section. Since the heat amount heated by infrared rays in the infrared detecting section and the supporting section is insulated by the hollow space, the infrared detecting section can detect an irradiation amount of infrared rays with good sensitivity.

The base plate is immersed in pure water for cleaning in the etching process. In this instance, the pure water enters the recessed portion. When the pure water is discharged from the recessed portion, the surface tension of the pure water acts, which causes the recessed portion and the supporting section to easily stick to the each other. The recessed portion is covered with the water repellent film that includes polysilicon. Since the water repellent film of polysilicon has water repellent properties, the pure water is easily discharged from the recessed portion in the base plate. Further, the supporting member includes silicon nitride or silicon carbonitride. Thus, the rigidity of the supporting section and the beam can be increased compared to a case where the supporting member is made of silicon or silicon oxide. Consequently, it is possible to prevent the supporting section from sticking to the bottom of the recessed portion.

Application Example 4

In the method for manufacturing the infrared detecting element according to the above-described application example, part of the water repellent film is exposed in the sacrifice film forming process; and etching is conducted to an exposed surface of the water repellent film and the supporting member is provided so as to overlap the water repellent film in the supporting member forming process.

According to this application example, part of the water repellent film is exposed in the sacrifice film forming process. The exposed water repellent film is made of polysilicon, and polysilicon becomes silicon oxide by oxidation. Since silicon oxide is easily etched in the etching process, there is a risk that the etching solution will leak. In the present embodiment, etching is conducted to an exposed surface of polysilicon, and the supporting member is provided so as to overlap. Consequently, silicon oxide can be removed even when it is formed, and thereby the etching solution can be prevented from leaking from the recessed portion in the etching process.

Further, since the sacrifice layer is etched when etching is conducted to the exposed surface of polysilicon, the surface of polysilicon becomes convex compared to a surface of the sacrifice layer. Consequently, the contact area between the water repellent film and the supporting member can be increased. In a case where the contact area between the water repellent film and the supporting member is large, it takes longer time for the etching solution to leak compared to a case where the contact area between the water repellent film and the supporting member is small. Consequently, the etching solution will not easily leak from the recessed portion to the insulating film.

Application Example 5

An electronic device of this application example has a light detecting section that detects infrared rays, and the light detecting section has the infrared detecting element according to the above-described application examples.

According to this application example, the electronic device has the light detecting section that detects infrared rays. The light detecting section has the infrared detecting element according to the above-described application examples. In the infrared detecting element according to the above-described application examples, the supporting section can be prevented from sticking to the bottom of the recessed portion when the base plate is cleaned, and the element can detect infrared rays with good sensitivity. It is thus possible to achieve an electronic device that has an infrared detecting element with good sensitivity as the light detecting section.

BRIEF DESCRIPTION OF THE DRAWINGS

Referring now to the attached drawings which form a part of this original disclosure.

DETAILED DESCRIPTION OF EXEMPLARY EMBODIMENTS

Hereinafter, embodiments of an infrared detecting element will be explained with reference to the attached drawings. In each drawing, the scale size of each component is different such that each component has a dimension to be recognized in each drawing.

First Embodiment

Figure 1A:
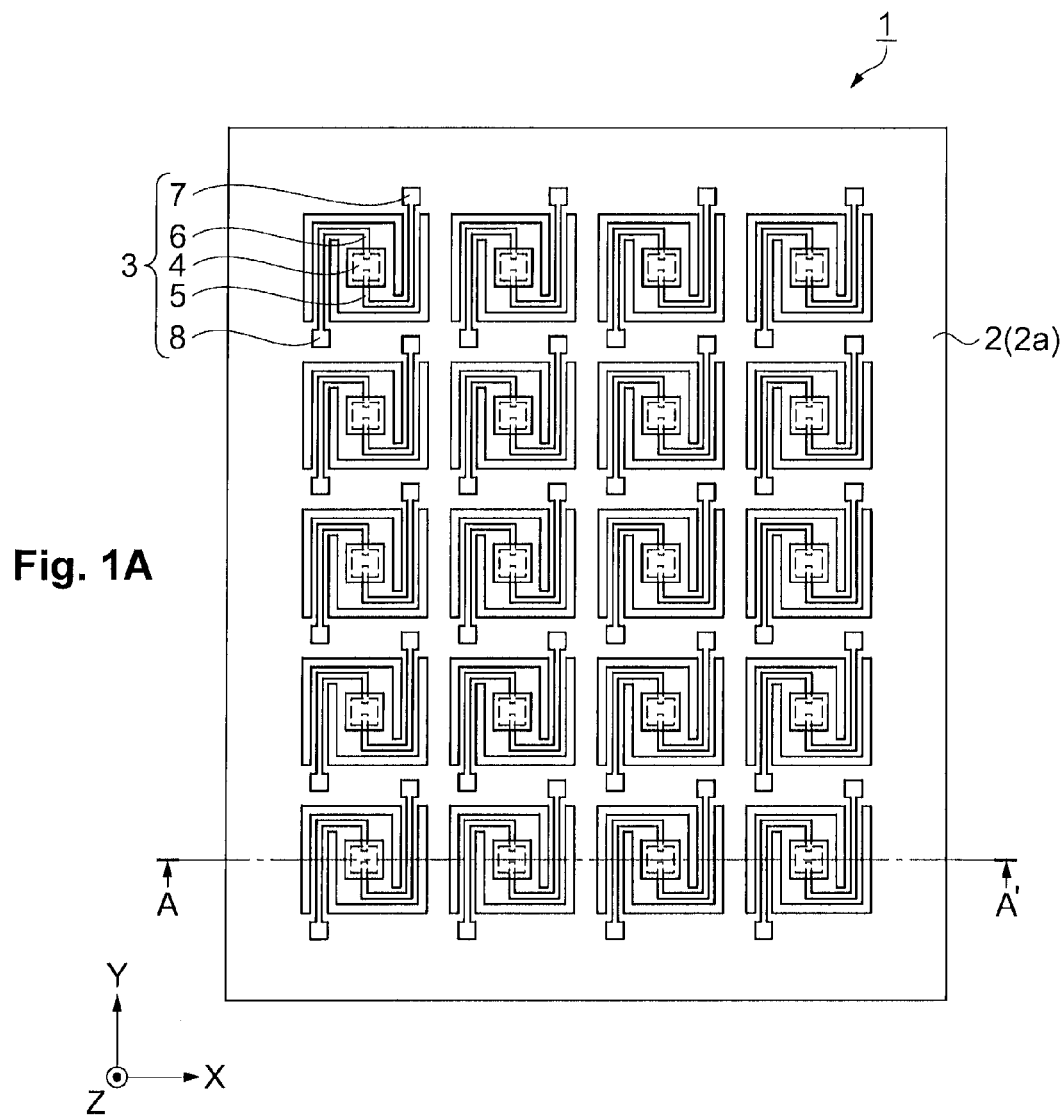
FIG. 1A is a schematic plan view showing a configuration of an infrared detecting device according to a first embodiment.
Figure 1B:
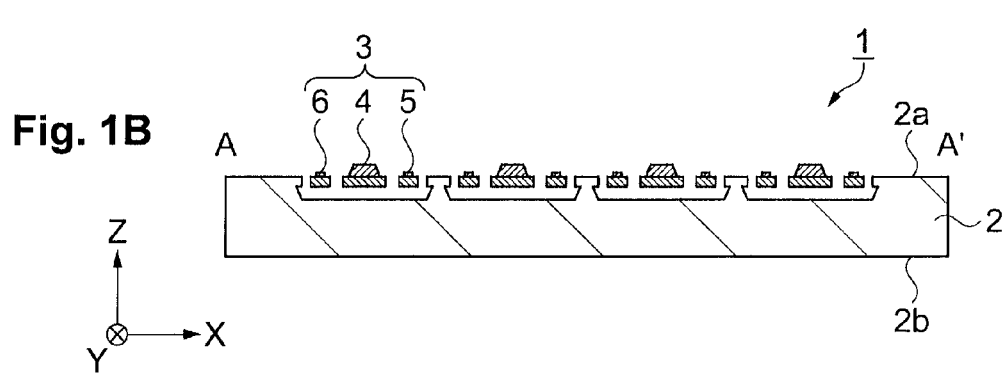
FIG. 1B is a schematic cross-sectional view of the configuration of the infrared detecting device.

In the present embodiment, characteristic examples of the infrared detecting element and a method for manufacturing the infrared detecting element will be explained with reference to FIG. 1-FIG. 6.
Infrared Detecting Device FIG. 1A is a schematic plan view showing a configuration of an infrared detecting device according to a first embodiment, and FIG. 1B is a schematic cross-sectional view of the configuration of the infrared detecting device. FIG. 1B is a cross-sectional view along A-A' line of FIG. 1A. As shown in FIG. 1, the infrared detecting device 1 has a base plate 2 having a rectangle in a plain view. The directions of two sides perpendicular to each other among four sides of the base plate 2 are referred to as X direction and Y direction. The vertical direction is −Z direction. The surface of the base plate 2 in Z direction is a base plate front surface 2a, and the surface of the base plate 2 in −Z direction is a base plate back surface 2b. The base plate front surface 2a and the base plate back surface 2b are opposite to each other.

Twenty infrared detecting elements 3 are provided on the base plate 2 in a grid pattern of five rows and four columns. However, the number of the infrared detecting elements 3 or the number of its alignment is not limited to a particular one. The number of the infrared detecting elements 3 can be 1-19, or 21 or more. The space resolution can further be improved as the number of the infrared detecting elements 3 is increased.

Figure 2A:
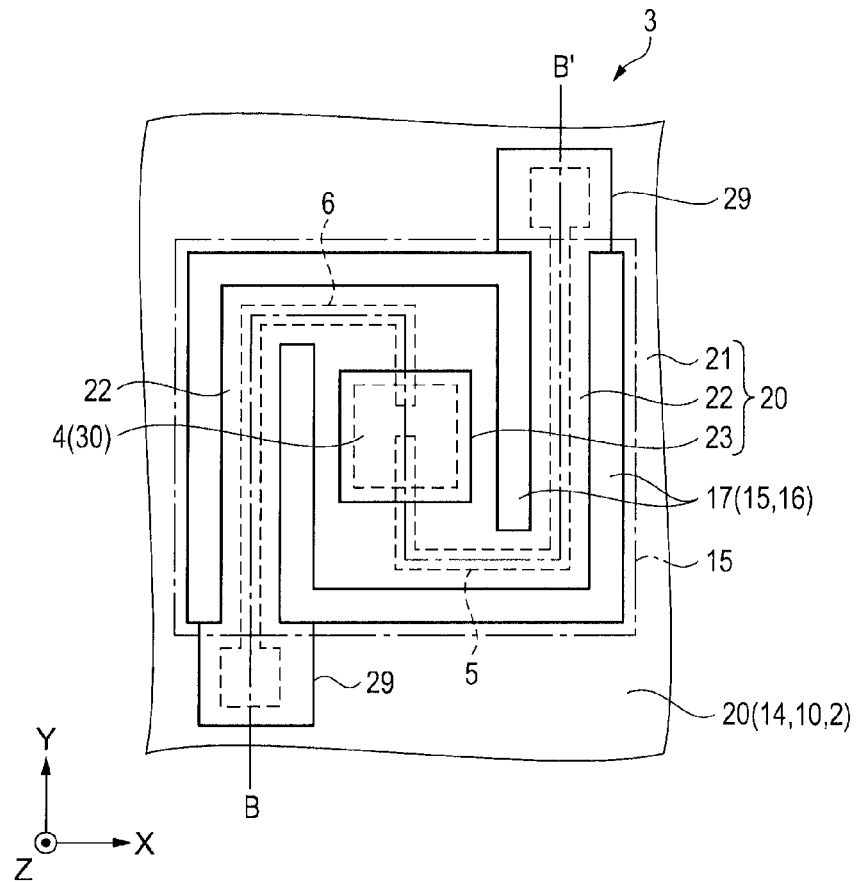
FIG. 2A is a plan view showing the main part of a configuration of an infrared detecting element.
Figure 2B:
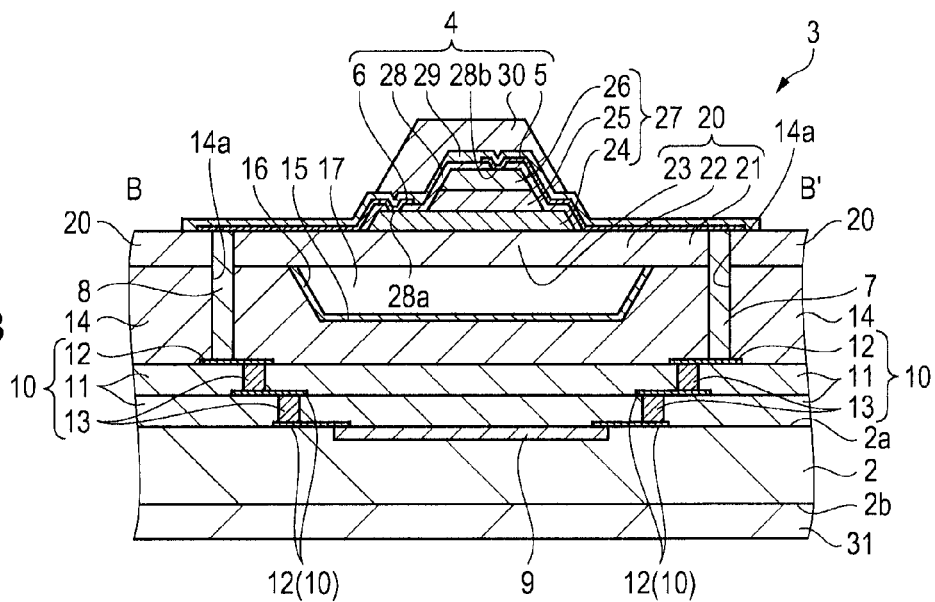
FIG. 2B is a sectional side view showing the main part of the configuration of the infrared detecting element.

An infrared detecting section 4 that detects infrared rays is provided in each infrared detecting element 3 on the base plate front surface 2a side of the base plate 2. An upper electrode wiring 5 and a lower electrode wiring 6 are provided so as to connect to the infrared detecting section 4. A film that is not shown in the drawing is layered on the base plate front surface 2a of the base plate 2. An upper penetrating electrode 7 and a lower penetrating electrode 8, that penetrate through this film, are formed. The upper electrode wiring 5 is connected to the upper penetrating electrode 7, and the lower electrode wiring 6 is connected to the lower penetrating electrode 8.
Infrared Detecting Element FIG. 2A is a plan view showing the main part of the configuration of the infrared detecting element, and FIG. 2B is a sectional side view showing the main part of the configuration of the infrared detecting element. FIG. 2B is a sectional view along B-B' line of FIG. 2A. As shown in FIG. 2, the infrared detecting element 3 has the base plate 2, and the base plate 2 is a silicon base plate. A drive circuit 9 is formed on the base plate front surface 2a of the base plate 2. The drive circuit 9 is a circuit in which semiconductor elements are integrated. A wiring layer 10 is provided on the base plate 2. A wiring layer insulating film 11 is layered in the wiring layer 10. A wiring 12 is provided between the wiring layer insulating films 11, on the base plate front surface 2a, and on the upper surface of the wiring layer 10. A penetrating electrode 13 that penetrates through each of the wiring layer insulating films 11 is provided so as to connect the wirings 12 located between the wiring layer insulating films 11, and on the base plate 2.

It is sufficient for the material of the wiring layer insulating film 11 to have insulating properties and easily be formed as a thin film, and the material is not limited to a particular one. For example, SiO$_2$ (silicon oxide) and the like can be used. It is sufficient for the materials of the wiring 12 and the penetrating electrode 13 to have good conductivity and easily be formed with a fine pattern, and the materials are not limited to a particular one. For example, metal such as Ti (titanium), W (tungsten), or Al (aluminum) can be used.

An insulating film 14 is formed on the wiring layer 10. Although the base plate 2 is illustrated to be thinner than the insulating film 14 so as to make the drawing more visible, the base plate 2 is a thicker plate than the insulating film 14. A recessed portion 15 is formed on a surface, that is upper in the drawing, of the insulating film 14. It is sufficient for the material of the insulating film 14 to have insulating properties and easily be formed as a thin film, and the material is not limited to a particular one. For example, SiO$_2$ (silicon oxide), SiN (silicon nitride), and SiCN (silicon carbonitride) can be used. In the present embodiment, SiO$_2$ is used as the material of the insulating film 14.

A water repellent film 16 is formed so as to cover the surface of the recessed portion 15, and the inside of the recessed portion 15 serves as a hollow space 17. A supporting member 20 is provided on the insulating film 14 and the hollow space 17. The supporting member 20 is constructed of a main body 21, and a beam 22, and a supporting section 23. The main body 21 is provided on the insulating film 14. The supporting section 23 is located above the hollow space 17, and has a rectangular shape. The infrared detecting section 4 is provided on the supporting section 23. One end of the beam 22 is fixed to the main body 21, and the other end of the beam 22 holds the supporting section 23. In FIG. 2B, the beam 22 is illustrated to be shorter so as to make the drawing more visible. However, as shown in FIG. 2A, the beam 22 is long in Y direction. By making the beam 22 long, heat transfer between the main body 21 and the supporting section 23 becomes small. In order to arrange the supporting section 23 and the beam 22 within a predetermined area, the beam 22 is shaped to be bent in two points. The shape and the length of the beam 22 are not limited to a particular one. However, as the beam 22 is longer, heat becomes harder to move. Accordingly, as the beam 22 is longer, the infrared detecting section 4 can detect infrared rays more accurately.

The water repellent film 16 serves to protect the insulating film 14 against an etching solution that is used when the hollow space 17 is formed. It is sufficient for the material of the water repellent film 16 to have corrosion resistance with respect to the etching solution and have water repellent properties with respect to pure water that is used for cleaning, and the material is not limited to a particular one. In the present embodiment, for example, polysilicon is used as the material of the water repellent film 16. It is sufficient for the material of the supporting member 20 to have corrosion resistance with respect to the etching solution that is used when the hollow space 17 is formed. For example, SiN (silicon nitride) or SiCN (silicon carbonitride) can be used as the material of the supporting member 20. The supporting member 20 can a single layer or have a multi-layered structure. A balance of internal stress can be achieved by using a multi-layered structure. Productivity can be improved in the case of a single layer because the number of the processes can be reduced compared to the case of a multi-layered structure. In the present embodiment, for example, SiN is used as the material of the supporting member 20.

A lower electrode 24 is provided on the supporting section 23, and a pyroelectric body 25 is provided so as to overlap the lower electrode 24. Further, an upper electrode 26 is provided so as to overlap the pyroelectric body 25. A capacitor 27 is constructed of the lower electrode 24, the pyroelectric body 25, the upper electrode 26, and the like. The polarization amount of the capacitor 27 changes in response to the temperature change. Accordingly, the temperature can be estimated by detecting the polarization amount of the capacitor 27.

It is sufficient for the material of the lower electrode 24 to be metal having good conductivity, and it is preferable to be metal having heat resistance. In the present embodiment, for example, as the material of the lower electrode 24, Ir (iridium), IrOx (iridium oxide), and Pt (platinum) are layered in this order. Ir has a function of controlling an orientation, IrOx functions as a reducing gas barrier, and Pt functions as a seed layer.

As the pyroelectric body 25, PZT (lead zirconate titanate) or PZTN in which Nb (niobium) is added to PZT can be used. It is sufficient for the material of the upper electrode 26 to be metal having good conductivity, and it is preferable to be metal having heat resistance. In the present embodiment, for example, as the material of the upper electrode 26, Pt (platinum), IrOx (iridium oxide), and Ir (iridium) are layered in this order. Pt has a function of aligning an orientation, IrOx functions as a reducing gas barrier, and Ir functions as a low resistance layer.

An insulating film 28 is provided so as to cover the capacitor 27. A first contact hole 28a that connects to the lower electrode 24 and a second contact hole 28b that connects to the upper electrode 26 are formed in the insulating film 28. The lower electrode wiring 6 and the upper electrode wiring 5 are provided on the supporting member 20 and the insulating film 28. The lower electrode wiring 6 is connected to the lower electrode 24 through the first contact hole 28a. Likewise, the upper electrode wiring 5 is connected to the upper electrode 26 through the second contact hole 28b.

It is sufficient for the material of the insulating film 28 to have insulating properties and easily be film-formed. In the present embodiment, for example, the insulating film 28 is a film in which a layer of $Al_2O_3$ (alumina) and a layer of $SiO_2$ or SiN are layered. The layer of $Al_2O_3$ functions as a gas barrier, and the layer of $SiO_2$ or SiN has a function of insulation. It is sufficient for the materials of the lower electrode wiring 6 and the upper electrode wiring 5 to have good conductivity and easily be film-formed. It is possible to use W (tungsten), Ti (titanium), Al (aluminum), and the like. In the present embodiment, for example, Al is used for the materials of the lower electrode wiring 6 and the upper electrode wiring 5.

An insulating film 29 is formed to overlap the upper electrode wiring 5, the lower electrode wiring 6, and the capacitor 27. The insulating film 29 is made of a material similar to the insulating film 28, and has a performance similar to the insulating film 28. The insulating film 29 has a function of electrical insulation and protection of the covering area.

An infrared absorbing film 30 is provided to overlap the capacitor 27. Since the infrared absorbing film 30 absorbs infrared rays without reflecting, the sensitivity of the infrared detecting element 3 can further be improved. The infrared detecting section 4 is constructed of the capacitor 27, the insulating film 28, the lower electrode wiring 6, the upper electrode wiring 5, the insulating film 29, the infrared absorbing film 30, and the like.

It is sufficient for the material of the infrared absorbing film 30 to have good absorptance with respect to infrared rays, and the material of the infrared absorbing film 30 is not limited to a particular one. As the infrared absorbing film 30, a silicon film, a silicon nitride film, a silicon oxide film, and an Au-black film can be used. An Au-black film is a porous gold film formed by a gas evaporation method. In the present embodiment, for example, a layered film of an SiN film and an $SiO_2$ film is used as the infrared absorbing film 30.

A via hole 14a is formed in the insulating film 14 and the supporting member 20. A conductive body is provided inside the via hole 14a, and the upper penetrating electrode 7 and the lower penetrating electrode 8 are constructed of the via hole 14a and the conductive body. The lower electrode wiring 6 and the lower penetrating electrode 8 are connected, and the upper electrode wiring 5 and the upper penetrating electrode 7 are connected. It is sufficient for the materials of the upper penetrating electrode 7 and the lower penetrating electrode 8 to have good conductivity and easily be film-formed. It is possible to use W, Ti, Al, and the like. In the present embodiment, for example, W is used for the materials of the upper penetrating electrode 7 and the lower penetrating electrode 8.

The upper penetrating electrode 7 and the lower penetrating electrode 8 are connected to the wiring 12 of the wiring layer 10. Consequently, the lower electrode 24 of the capacitor 27 is connected to the drive circuit 9 through the lower electrode wiring 6, the lower penetrating electrode 8, the wiring 12, and the penetrating electrode 13. Likewise, the upper electrode 26 of the capacitor 27 is connected to the drive circuit 9 through the upper electrode wiring 5, the upper penetrating electrode 7, the wiring 12, and the penetrating electrode 13. Consequently, the drive circuit 9 can detect the polarization amount of the capacitor 27 by inputting signals from the wiring 12.

A warpage control film 31 is provided on the base plate back surface 2b of the base plate 2. The warpage control film 31 is a film provided to control warpage of the base plate 2 caused by films such as the insulating film 14, the supporting member 20, and the like. Accordingly, it is preferable to adjust the film thickness of the warpage control film 31 corresponding to the warpage amount of the base plate 2. As the material of the warpage control film 31, $SiO_2$, SiN, SiCN, and the like can be used. The warpage control film 31 can a single layer or have a multi-layered structure. In the present embodiment, for example, SiN is used as the material of the warpage control film 31.

When the infrared detecting element 3 is irradiated by infrared rays, the infrared detecting section 4 absorbs the infrared rays and the temperature increases. The infrared absorbing film 30 is provided on a surface of the infrared detecting section 4 to be irradiated by infrared rays. Therefore, the infrared detecting section 4 efficiently absorbs infrared rays, so that the temperature can be increased. The polarization amount of the pyroelectric body 25 provided in the infrared detecting section 4 changes in response to the temperature change. Accordingly, the temperature of the infrared detecting section 4 can be detected by applying voltage to the capacitor 27 and detecting the polarization amount of the pyroelectric body 25. Then, the irradiation amount of infrared rays to the infrared detecting section 4 can be detected by using detection results of the temperature change in the infrared detecting section 4.

Method for Manufacturing Infrared Detecting Element

Figure 3:
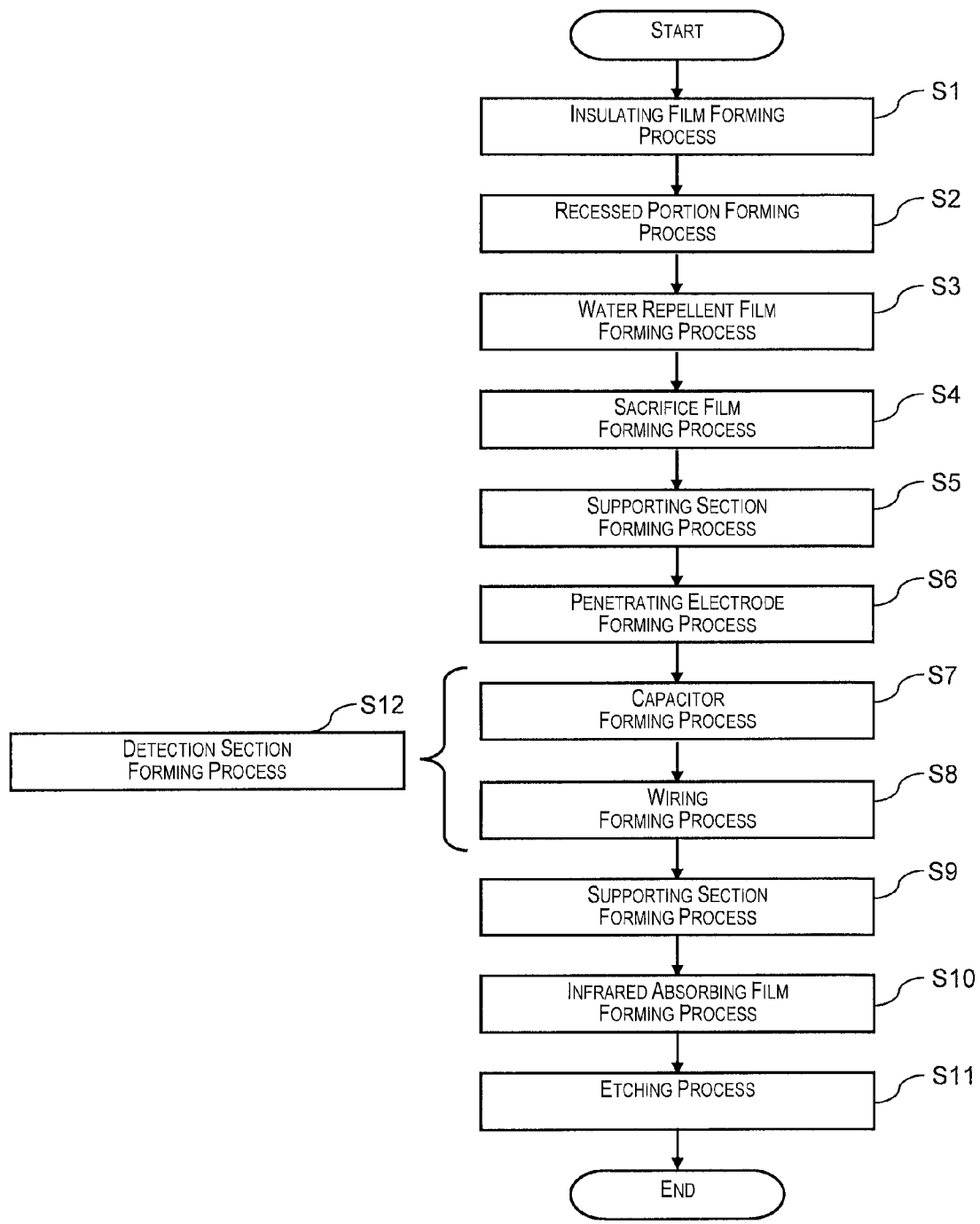
FIG. 3 is a flow chart showing a method for manufacturing the infrared detecting element.

A method for manufacturing the infrared detecting element 3 described above will be explained with reference to FIG. 3 to FIG. 6. FIG. 3 is a flow chart showing the method for manufacturing the infrared detecting element, and FIG. 4 to FIG. 6 are a diagram explaining the method for manufacturing the infrared detecting element.

In the flow chart of FIG. 3, step S1 corresponds to an insulating film forming process. This is a process for forming the insulating film on the wiring layer, and forming the warpage control film on the base plate back surface. Next, this moves on to step S2. Step S2 corresponds to a recessed portion forming process, and this is a process for forming the recessed portion in the insulating film. Next, this moves on to step S3. Step S3 corresponds to a water repellent film forming process, and this is a process for forming the water repellent film to cover the recessed portion. Next, this moves on to step S4. Step S4 corresponds to a sacrifice film forming process, and this is a process for filling the recessed portion with a sacrifice film. The sacrifice film is a film that is to be removed in a subsequent process. Next, this moves on to step S5.

Step S5 corresponds to a supporting member forming process, and this is a process for forming the supporting member to overlap the insulating film and the sacrifice film. Next, this moves on to step S6. Step S6 corresponds to a penetrating electrode forming process, and this is a process for forming the penetrating electrode that penetrates the insulating film. Next, this moves on to step S7. Step S7 corresponds to a capacitor forming process, and this is a process for forming the capacitor on the supporting member. Next, this moves on to step S8. Step S8 corresponds to a wiring forming process, and this is a process for forming the wiring that is connected to the capacitor. Next, this moves on to step S9. Step S9 corresponds to a supporting section forming process, and this is a process for forming the shapes of the supporting section and the beam. Next, this moves on to step S10.

Step S10 corresponds to an infrared absorbing film forming process. This is a process for forming the insulating film to overlap the wiring and the capacitor, and forming the infrared absorbing film to cover the capacitor. Next, this moves on to step S11. Step S11 corresponds to an etching process, and this is a process for forming the hollow space between the recessed portion and the supporting section. The infrared detecting element is completed by the above manufacturing processes. Incidentally, a detecting section forming process of step S12 is constructed of the capacitor forming process of step S7 and the wiring forming process of step S8.

Figure 4A:
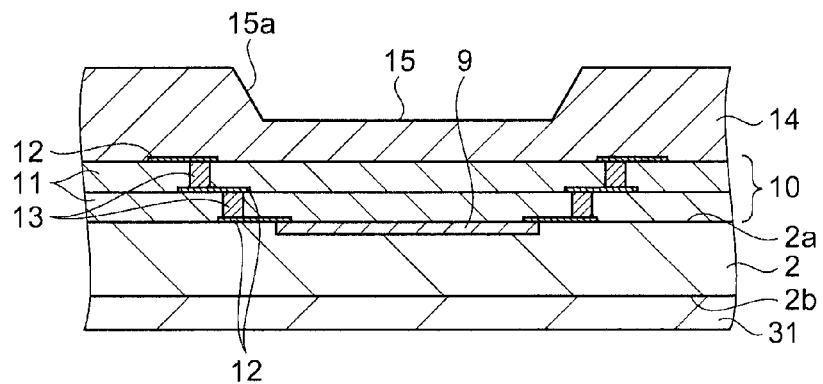
FIG. 4 is a diagram explaining the method for manufacturing the infrared detecting element.

Next, the details of the manufacturing method will be explained in accordance with the steps shown in FIG. 3 and with reference to FIG. 4 to FIG. 6. FIG. 4A is a diagram corresponding to the insulating film forming process of step S1 and the recessed portion forming process of step S2. As shown in FIG. 4A, the base plate 2 on which the drive circuit 9 and the wiring layer 10 have been formed is prepared. The drive circuit 9 is a semiconductor circuit, and can be manufactured by a known method. Also, regarding the wiring layer 10, a method for forming the wiring 12, a method for forming the wiring layer insulating films 11, and a method for forming the penetrating electrode 13 are known. Since the method for forming the drive circuit 9 and the method for forming the wiring layer 10 are known, they will not be explained.

In step S1, the insulating film 14 is formed on the wiring layer 10, and the warpage control film 31 is formed on the base plate back surface 2b. In this instance, an $SiO_2$ film is formed as the insulating film 14 and an SiN film is formed as the warpage control film 31 by using a CVD (Chemical Vapor Deposition) method. Next, in step S2, a mask is formed by using a photolithography method, and the recessed portion 15 is formed by a dry etching method. Side surfaces 15a of the recessed portion 15 are made inclined with respect to the base platet front surface 2a by adjusting the manufacturing conditions of the dry etching method. Next, the mask is removed, and the recessed portion 15 is completed.

Figure 4B:
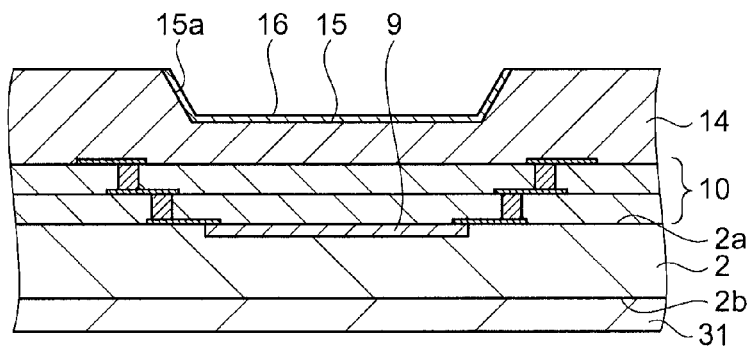

FIG. 4B is a diagram corresponding to the water repellent film forming process of step S3. As shown in FIG. 4B, the water repellent film 16 made of polysilicon is formed on the recessed portion 15 and the insulating film 14 by using a low pressure CVD method. Since a film formed by using a low pressure CVD can achieve step coverage, a film surely can be formed on the side surfaces 15a. Next, a mask is formed by using a photolithography method, and the water repellent film 16 is removed except in the recessed portion 15 by using a dry etching method.

Figure 4C:
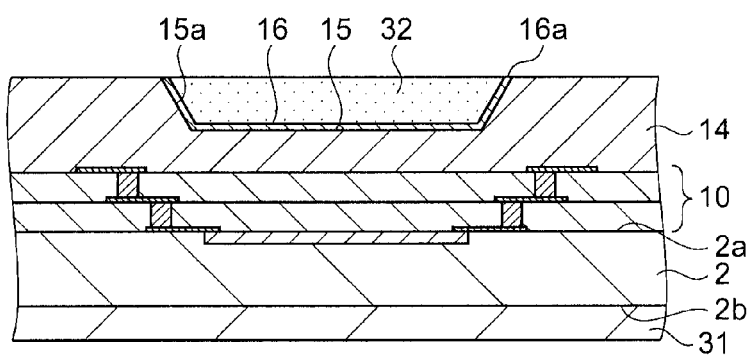

FIG. 4C is a diagram corresponding to the sacrifice film forming process of step S4. As shown in FIG. 4C, the sacrifice film 32 made of an $SiO_2$ film is formed on the insulating film 14 by using a CVD method in step S4. In this instance, an $SiO_2$ film is formed on the insulating film 14 in addition to the recessed portion 15, and the thickness of the film is made greater than the depth of the recessed portion 15. Next, the upper surface of the sacrifice film 32 is made flat by using a CMP (Chemical Mechanical Polishing) method, and the surface of the insulating film 14 and the surface of the sacrifice film 32 are made the same. In this instance, a surface 16a that is part of the water repellent film 16 is exposed.

Figure 4D:
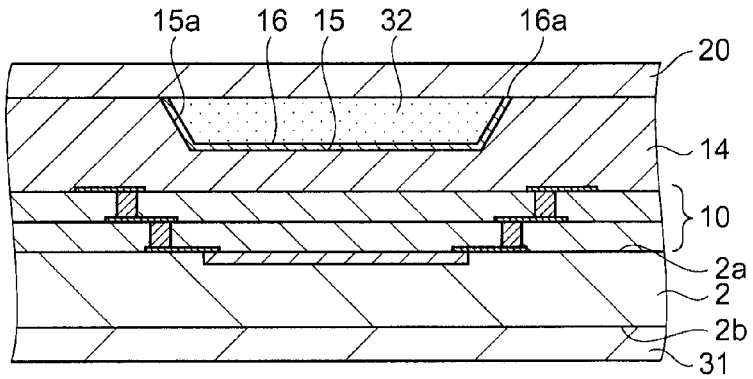

FIG. 4D is a diagram corresponding to the supporting member forming process of step S5. As shown in FIG. 4D, the supporting member 20 is formed on the insulating film 14, the water repellent film 16, and the sacrifice film 32 in step S5. First, etching is conducted to the surfaces of the insulating film 14, the water repellent film 16, and the sacrifice film 32. In this manner, the oxidized part of the water repellent film 16 is removed. Further, the exposed surface 16a of the water repellent film 16 becomes convex by etching the insulating film 14 and the sacrifice film 32, and thus the surface area of the surface 16a can be increased. Next, an SiN film is formed by using a CVD method.

Figure 5A:
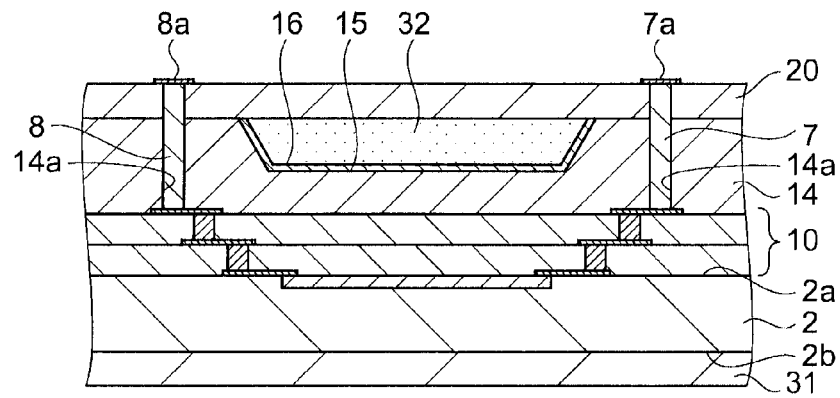
FIG. 5 is a diagram explaining the method for manufacturing the infrared detecting element.

FIG. 5A is a diagram corresponding to the penetrating electrode forming process of step S6. As shown in FIG. 5A, the upper penetrating electrode 7 and the lower penetrating electrode 8 that penetrate the insulating film 14 and the supporting member 20 are formed in step S6. First, a mask is formed by using a photolithography method, and the via hole 14a is formed by a dry etching method. Next, metal such as tungsten is filled, and thereby the upper penetrating electrode 7 and the lower penetrating electrode 8 are formed.

Next, a terminal 7a is formed at the end of the upper penetrating electrode 7 on the upper side in the drawing. Regarding the terminal 7a, it can be possible to use a film that is generated when the upper penetrating electrode 7 is formed. Alternatively, it can be possible to separately form a film. Likewise, a terminal 8a is formed at the end of the lower penetrating electrode 8 on the upper side in the drawing. A mask is formed by using a photolithography method, and the terminal 7a and the terminal 8a are formed by a dry etching method.

Figure 5B:
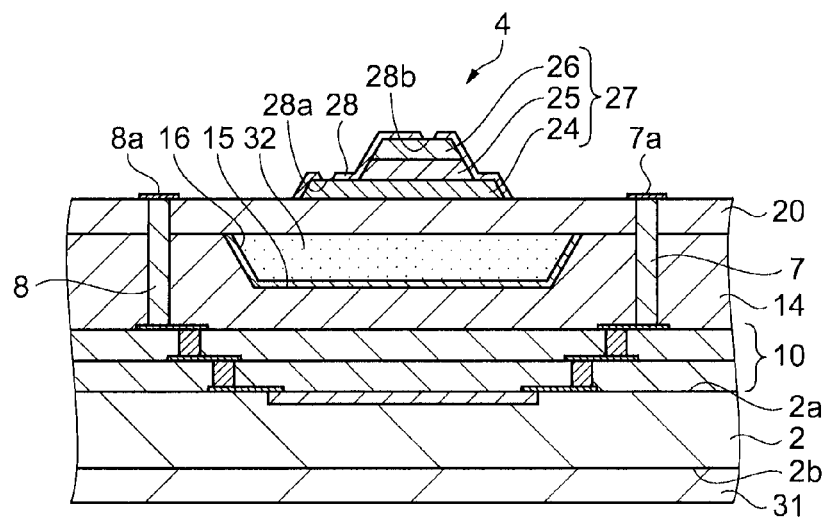

FIG. 5B is a diagram corresponding to the capacitor forming process of step S7. As shown in FIG. 5B, in step S7, first, a film to become the lower electrode 24 is formed. Ir (iridium), IrOx (iridium oxide), and Pt (platinum) are layered in this order by a sputtering method. Next, a mask is formed by using a photolithography method, and the lower electrode 24 is formed by a dry etching method.

The crystalline orientation of the pyroelectric body 25, the lower electrode 24, and the upper electrode 26 of the capacitor 27 is aligned such that the preferred orientation direction is a (111) plane direction, for example. Since the preferred orientation direction is made a (111) plane direction, the orientation ratio of the (111) orientation with respect to all the plane directions is controlled to be 90% or more, for example. In order to increase the pyroelectric coefficient, the (100) orientation rather than the (111) orientation is preferable. However, the (111) orientation is selected to easily control the polarization with respect to the applied electric field direction. An orientation control layer of Ir is formed such that the preferred orientation is in the (111) plane, for example. However, the preferred orientation direction is not limited to this.

The supporting member 20 is an SiN film. Regarding an SiN film, it is possible to form a flat film having a small surface roughness. Accordingly, the surface of the lower electrode 24 formed on the supporting member 20 can be as designed. As a result of this, the lower electrode 24 can control the orientation of the pyroelectric body 25 with good accuracy.

Next, the pyroelectric body 25 is formed. A material for making the pyroelectric body 25 is applied and heated, and crystal growth is caused such that the preferred orientation is in the (111) direction, for example. Due to the orientation control of the lower electrode 24, the pyroelectric body 25 is oriented according to the lower electrode 24. Also, when the material of the pyroelectric body 25 is heated, IrOx (iridium oxide) of the lower electrode 24 prevents the material of the pyroelectric body 25 from becoming reduced due to the obstructive factor of the reducing character from the supporting member 20 side.

Next, a film to become the upper electrode 26 is formed. Pt (platinum), IrOx (iridium oxide), and Ir (iridium) are layered in this order by a sputtering method. Next, Pt (platinum) is heated and recrystallized. In this manner, the crystalline orientation of the Pt (platinum) layer is matched to that of the pyroelectric body 25. Subsequently, a mask is formed by using a photolithography method, and the pyroelectric body 25 and the upper electrode 26 are formed by a dry etching method. Preferably, the side surfaces of the lower electrode 24, the pyroelectric body 25, and the upper electrode 26 are made inclined by adjusting the etching conditions. In this manner, the insulating film 28 can be formed on the capacitor 27 with good quality.

Next, a reducing gas barrier layer is formed by overlapping the lower electrode 24, the pyroelectric body 25, and the upper electrode 26. The barrier layer is formed by film-forming, for example, aluminum oxide $Al_2O_3$ by a sputtering method or a CVD method. Subsequently, the insulating film 28 is formed. In order to form the insulating film 28, a film of $SiO_2$ or SiN is formed by a CVD method. Next, a mask is formed by using a photolithography method, and patterning is conducted to the reducing gas barrier layer and the insulating film 28 by a dry etching method. In the patterning, the external shapes of the reducing gas barrier layer and the insulating film 28, and the first contact hole 28a and the second contact hole 28b are formed.

Figure 5C:
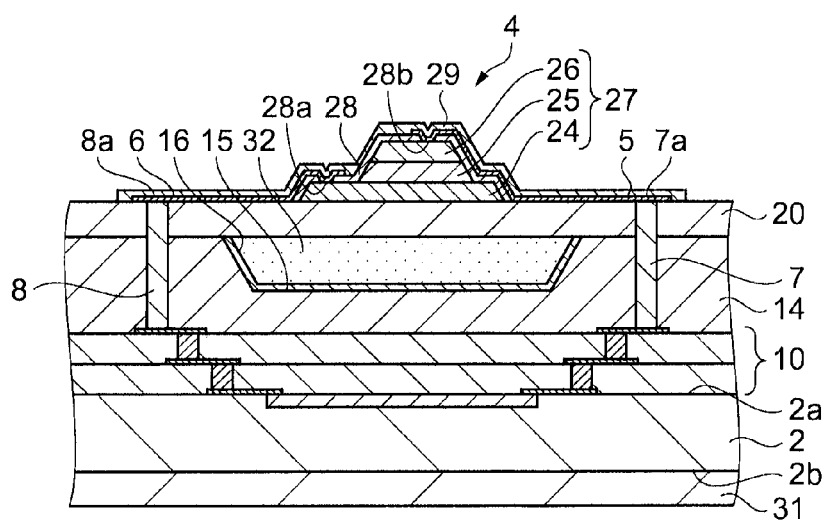

FIG. 5C is a diagram corresponding to the wiring forming process of step S8. As shown in FIG. 5C, the upper electrode wiring 5 and the lower electrode wiring 6 are formed so as to overlap the insulating film 28 in step S8. A film is attached by conducting sputtering with a wiring material such as Al (aluminum), and then patterning is conducted. The upper electrode wiring 5 is provided so as to connect from the second contact hole 28b to the terminal 7a. The lower electrode wiring 6 is provided so as to connect from the first contact hole 28a to the terminal 8a.

Figure 6A:
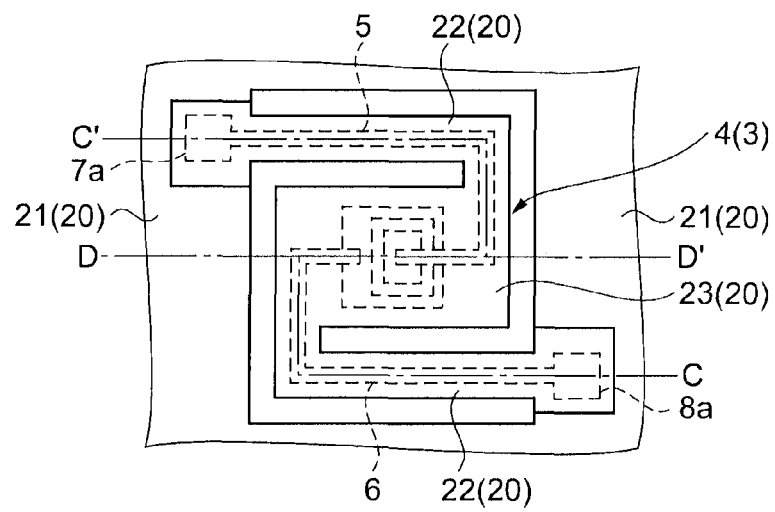
FIG. 6 is a diagram explaining the method for manufacturing the infrared detecting element.

FIG. 6A is a diagram corresponding to the supporting section forming process of step S9. As shown in FIG. 6A, the beam 22 and the supporting section 23 are formed in step S9. A mask is formed by using a photolithography method, and patterning is conducted to the supporting member 20 by a dry etching method. In this manner, the planar shape of the supporting member 20 is formed into the shapes of the supporting section 23, the beam 22, and the main body 21.

Figure 6B:
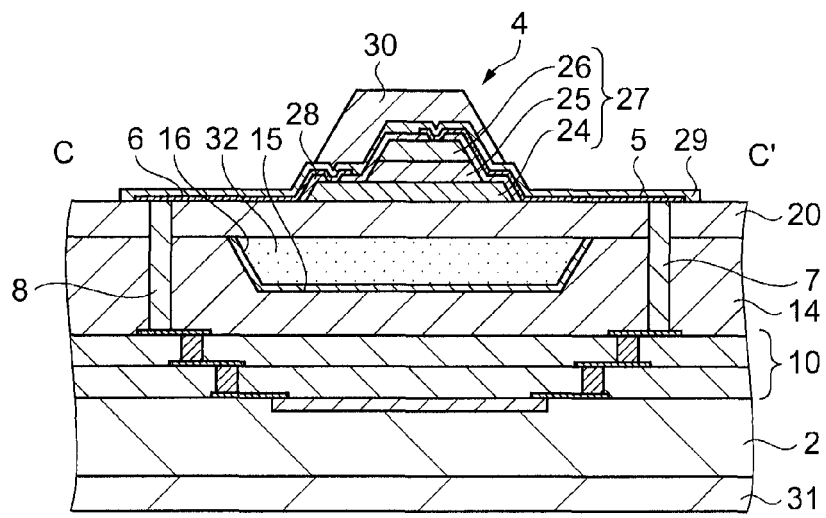

FIG. 6B is a diagram corresponding to the infrared absorbing film forming process of step S10, and a schematic cross-sectional view along C-C' line of FIG. 6A. As shown in FIG. 6B, the infrared absorbing film 30 is formed to overlap the insulating film 29 on the capacitor 27 in step S10. SiN and $SiO_2$ are formed by a CVD method. Then, a mask is formed by using a photolithography method, and patterning is conducted to the infrared absorbing film 30 by a dry etching method.

Figure 6C:
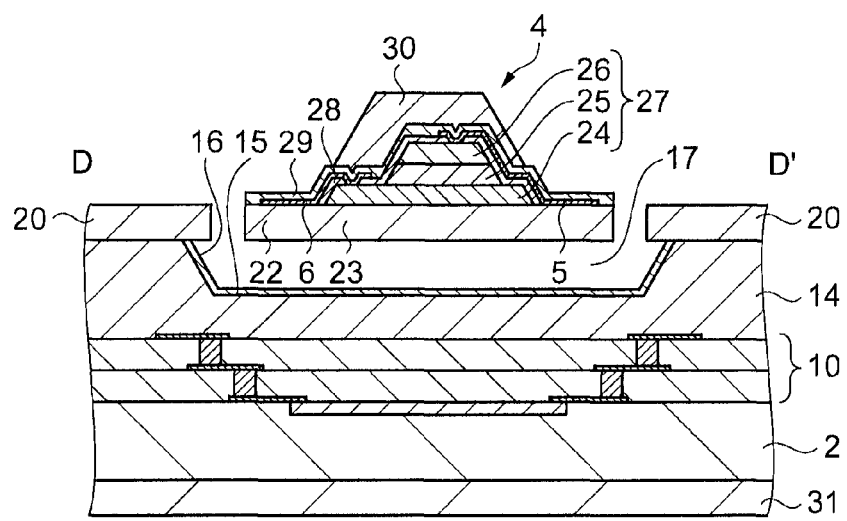

FIG. 6C is a diagram corresponding to the etching process of step S11, and a schematic cross-sectional view along D-D' line of FIG. 6A. As shown in FIG. 6C, etching is conducted to remove the sacrifice film 32, and the hollow space 17 is formed in an area where the sacrifice film 32 used to exist. A mask is formed to cover the supporting member 20 and the infrared detecting section 4 by using a photolithography method, and patterning is conducted. As a resist, one having high resistance to an etching solution of hydrogen fluoride is used. Next, by immersing the base plate 2 in an etching solution of hydrogen fluoride, the etching solution is caused to contact the sacrifice film 32 from between the main body 21 and the supporting section 23 of the supporting member 20. Then, SiO$_2$ of the sacrifice film 32 is corroded and removed, and the hollow space 17 is formed. The supporting member 20 and the water repellent film 16 are a film that has corrosion resistance to the etching solution. Consequently, the etching solution etches only the sacrifice film 32 without etching the supporting member 20 and the water repellent film 16. Subsequently, cleaning is conducted with pure water, and drying is conducted. Since the water repellent film 16 repels pure water, the pure water is easily discharged from the recessed portion 15. Also, the material of the supporting member 20 is SiN that has high rigidity, the supporting section 23 does not easily stick to the bottom of the recessed portion 15. Then, the pure water is discharged from the recessed portion 15. Subsequently, the infrared detecting element 3 is completed by removing the mask.

Comparative Example

Next, a comparative example is introduced, in which a (111) plane orientation ratio is compared between a case where polysilicon is used as the material of the supporting member 20 and a case where SiN is used as the material of the supporting member 20. The (111) plane orientation ratio can be expressed by the following equation (Equation 1). Here, the (111) plane peak intensity shows an X-ray diffraction peak intensity in a crystal plane (111) of a PZT thin film.

[Equation 1]

$Ir(111)$ : (111) plane orientation ratio          (1)
$Ip(111)$ : (111) plane peak intensity of PZT thin film
$Ip(110)$ : (110) plane peak intensity of PZT thin film
$Ip(100)$ : (100) plane peak intensity of PZT thin film $$Ir(111) = \frac{Ip(111) \times 100(\%)}{Ip(111) + Ip(110) + Ip(100)}$$

Figure 7:
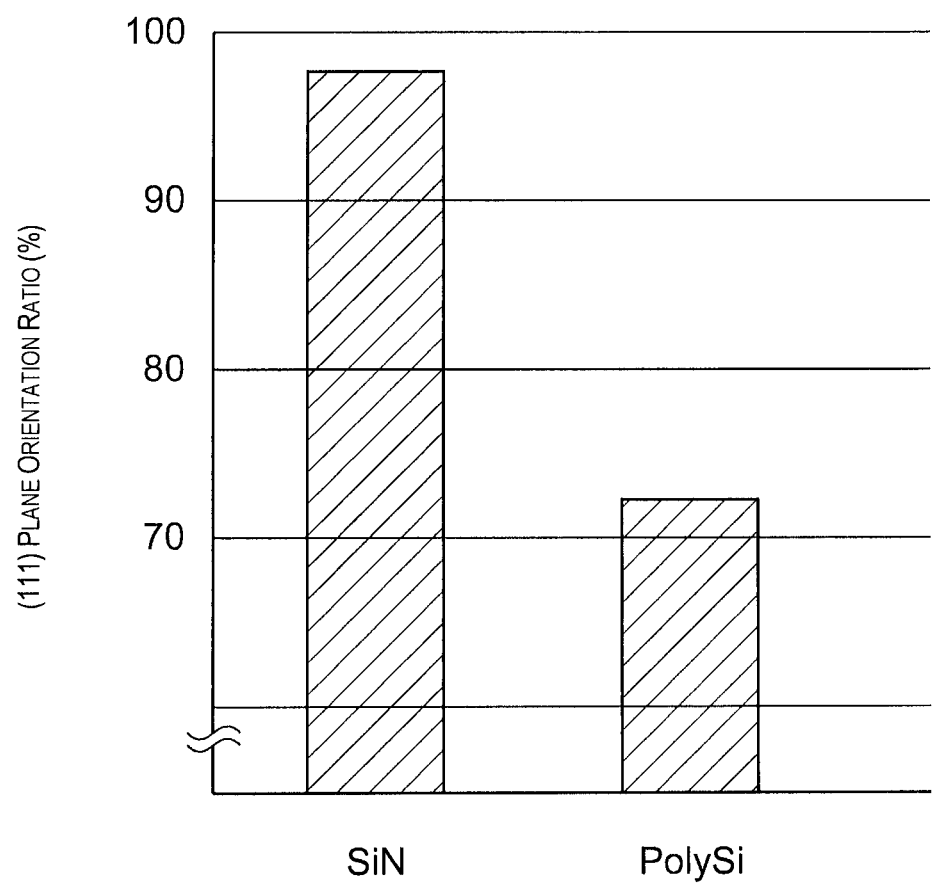
FIG. 7 is a graph comparing a (111) plane orientation ratio between a case where polysilicon is used as the material of the supporting member and a case where SiN is used as the material of the supporting member according to a comparative example.

FIG. 7 is a graph comparing the (111) plane orientation ratio between a case where polysilicon is used as the material of the supporting member and a case where SiN is used as the material of the supporting member. As shown in FIG. 7, when the material of the supporting member 20 is polysilicon, the (111) plane orientation ratio is approximately 73%. When the material of the supporting member 20 is SiN, the (111) plane orientation ratio is approximately 98%. Apparently, the (111) plane orientation ratio can be increased in the case where the material of the supporting member 20 is SiN compared to the case where the material of the supporting member 20 is polysilicon. As a result, by using SiN as the material of the supporting member 20, the sensitivity of the infrared detecting section 4 can be improved.

As described above, the present embodiment has the following effects:

(1) According to the present embodiment, in the etching process of step S11 for forming the hollow space 17, the base plate 2 is cleaned with pure water. The recessed portion 15 is covered with the water repellent film 16 of polysilicon. Since the water repellent film 16 has water repellent properties, the pure water is easily discharged from the recessed portion 15. Further, the surface tension of the pure water does not easily act between the supporting section 23 and the recessed portion 15 when the pure water is discharged from the recessed portion 15. The material of the beam 22 and the supporting section 23 is silicon nitride. Silicon nitride is a material that has high rigidity compared to silicon or silicon oxide. It is thus possible to prevent the supporting section 23 from sticking to the bottom of the recessed portion 15 when the pure water is discharged from the recessed portion 15.

(2) According to the present embodiment, the infrared detecting section 4 has the lower electrode 24, the pyroelectric body 25, and the upper electrode 26 that are provided and layered on the supporting section 23. Further, since the pyroelectric body 25 has a preferred orientation due to the lower electrode 24, infrared rays can be detected with good sensitivity. The lower electrode 24 is provided on the supporting section 23 of silicon nitride. Since the surface roughness can be made small when a film of silicon nitride is formed, the lower electrode 24 can be provided on the flat supporting section 23. Consequently, the lower electrode 24 can accurately be formed, and a preferred orientation can be achieved in the pyroelectric body 25. As a result, the sensitivity of the infrared detecting element 3 can further be improved.

(3) According to the present embodiment, the surface 16a that is part of the water repellent film 16 is exposed in the sacrifice film forming process of step S4. The exposed water repellent film 16 is made of polysilicon, and polysilicon becomes silicon oxide by oxidation. Since silicon oxide is easily etched in the etching process of step S11, there is a risk that the etching solution will leak. According to the present embodiment, in the supporting member forming process of step S5, etching is conducted to the exposed surface 16a of polysilicon, and the supporting member 20 is provided so as to overlap. Consequently, silicon oxide can be removed in step S5 even when it is formed in step S4, so that the etching solution can be prevented from leaking in the etching process of step S11.

Further, since the insulating film 14 and the sacrifice film 32 are etched when etching is conducted to the surface 16a of polysilicon in step S5, the surface 16a of the water repellent film 16 becomes convex. Consequently, the contact area between the water repellent film 16 and the supporting member 20 can be increased, and thus the etching solution will not easily leak in the etching process of step S11.

(4) According to the present embodiment, the hollow space 17 is formed in the etching process of step S11 by using wet etching. In a method using dry etching disclosed in Patent Document 1, the infrared detecting section 4 is exposed to the circumstances where the temperature is high and the plasma is generated for a long period of time. Consequently, the infrared detecting section 4 is more likely to be damaged. In contrast, according to the method of the present embodiment, since the infrared detecting section 4 is not exposed to the circumstances where the temperature is high and the plasma is generated for a long period of time, the infrared detecting section 4 will not easily be damaged.

(5) According to the present embodiment, the hollow space 17 is formed in the etching process of step S11 by using wet etching. Since wet etching is conducted by immersing the base plate 2 in an etching solution, etching can be conducted to a number of base plates 2 concurrently. Consequently, the hollow space 17 can be formed with good productivity compared to the method using dry etching.

Second Embodiment

Figure 8A:
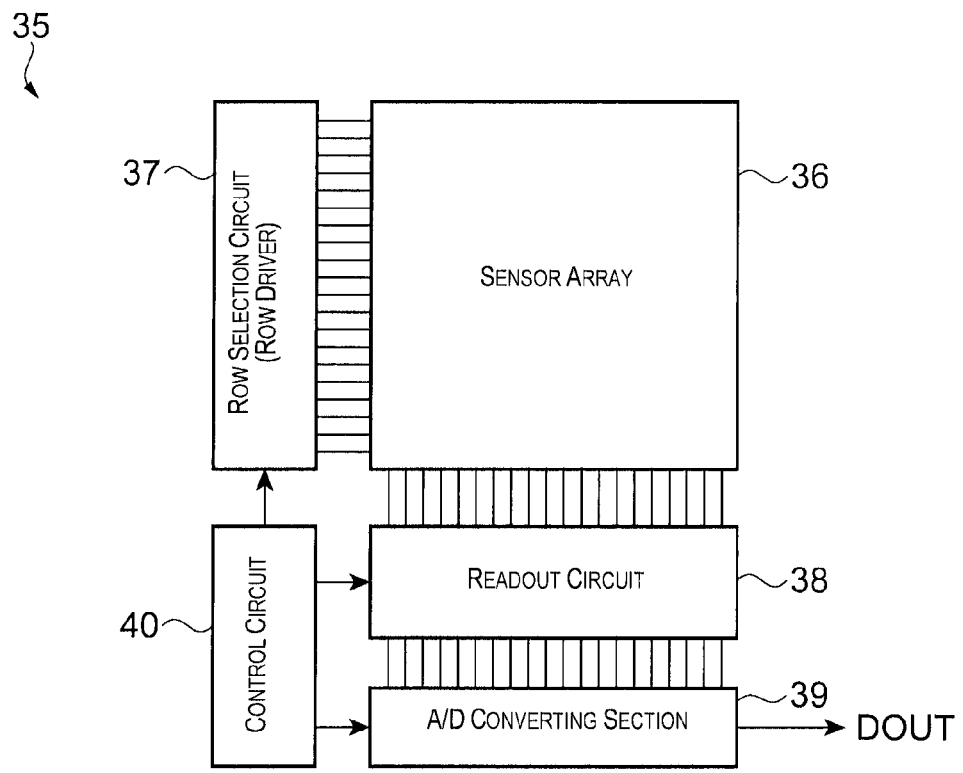
FIG. 8A is a block diagram showing a configuration of an infrared detecting device according to a second embodiment.
Figure 8B:
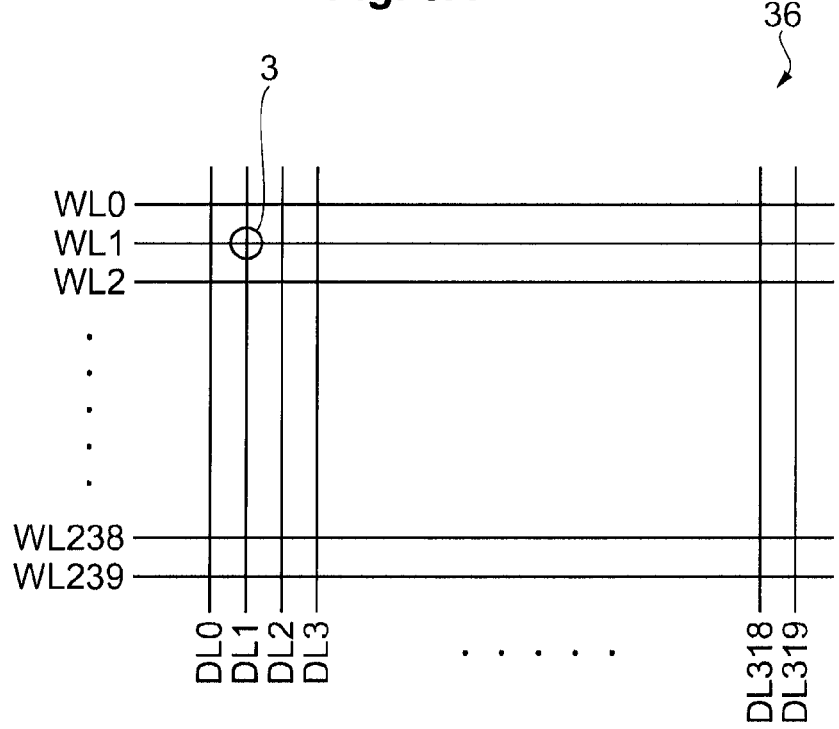
FIG. 8B is a diagram explaining an alignment of the infrared detecting elements.

Next, another embodiment of the infrared detecting device will be explained with reference to FIG. 8. FIG. 8A is a block diagram showing a configuration of the infrared detecting device, and FIG. 8B is a diagram explaining an alignment of the infrared detecting elements. In the present embodiment, an example of driving operation of the drive circuit 9 in the first embodiment will be explained in detail. The same points as the first embodiment will not be explained.

In the present embodiment, as shown in FIG. 8A, a sensor device 35 as an electronic device includes a sensor array 36, a row selection circuit 37, and a readout circuit 38. The sensor device 35 further includes an A/D converting section 39 and a control circuit 40. The row selection circuit 37 is referred to as a row driver. The drive circuit 9 in the first embodiment has the row selection circuit 37, the readout circuit 38, the A/D converting section 39, the control circuit 40, and the like. By using the sensor device 35, an infrared camera and the like used for a night vision device and the like, for example, can be achieved.

As shown in FIG. 8A, the sensor device 35 has the sensor array 36. As shown in FIG. 8B, in the sensor array 36, the plurality of infrared detecting elements 3 are aligned in a grid pattern. A plurality of row lines and a plurality of column lines are also provided. The row line is also referred to as a word line or a scan line, and the column line is also referred to as a data line. The number of one of the row line and the column line can be one. For example, when the number of the row line is one, the plurality of the infrared detecting elements 3 are aligned along the direction of the row line (the lateral direction in the drawing). On the other hand, when the number of the column line is one, the plurality of the infrared detecting elements 3 are aligned along the direction of the column line (the vertical direction in the drawing).

Each infrared detecting element 3 of the sensor array 36 is provided in a position that corresponds to the intersection between each row line and each column line. For example, one of the infrared detecting elements 3 is provided in a position that corresponds to the intersection between the row line WL1 and the column line DL1. The other infrared detecting elements 3 are provided in the same manner. The size of the sensor array 36 is not limited to a particular one. In the present embodiment, for example, the sensor array 36 is QVGA (Quarter Video Graphics Array) of 320×240 pixels. Row lines WL0, WL1, WL2 . . . WL239 and column lines DL0, DL1, DL2 . . . DL319 are provided.

As shown in FIG. 8A, the row selection circuit 37 is connected to a plurality of row lines, and conducts operation of selecting each row line. Specifically, the row selection circuit 37 conducts operation of sequentially selecting and scanning the row lines WL0, WL1, WL2 . . . WL239. Word selection signals that are signals for selecting these row lines are output to the sensor array 36.

The readout circuit 38 is connected to a plurality of column lines, and conducts operation of reading out each column line. For example, in the sensor array 36 of QVGA, the readout circuit 38 conducts operation of reading out detection signals (detection current, detection charge) from the column lines DL0, DL1, DL2 . . . DL319.

The A/D converting section 39 conducts A/D conversion processing to convert detection voltage (measured voltage, attained voltage) obtained in the readout circuit 38 to digital data, and outputs digital data DOUT after A/D conversion is conducted. More specifically, in the A/D converting section 39, each A/D convertor is provided corresponding to each column line of the plurality of column lines. Each A/D convertor conducts A/D conversion processing to detection voltage obtained by the readout circuit 38 with respect to the corresponding column line. A single A/D convertor can be provided corresponding to the plurality of column lines, and A/D conversion can be conducted to detection voltage with respect to the plurality of column lines by time division using the single A/D convertor.

The control circuit 40 generates various kinds of control signals and outputs them to the row selection circuit 37, the readout circuit 38, and the A/D converting section 39. For example, the control circuit 40 generates and outputs control signals of charge or discharge (reset). Alternatively, the control circuit 40 generates and outputs signals for controlling timing of each circuit. The drive circuit 9 according to the first embodiment is constructed of the row selection circuit 37, the readout circuit 38, the A/D converting section 39, the control circuit 40, and the like.

As described above, the present embodiment has the following effect:

(1) According to the present embodiment, since the sensor device 35 has the infrared detecting elements 3 aligned in a grid pattern. The row selection circuit 37 and the readout circuit 38 sequentially select the infrared detecting elements 3, and the amount of receiving infrared light is detected and output. The infrared detecting elements 3 detect the amount of receiving infrared light with good sensitivity because the supporting section 23 does not stick to the recessed portion 15. Consequently, the sensor device 35 can be a device provided with the infrared detecting elements 3 that can detect distribution of emitted infrared rays with good sensitivity.

Third Embodiment

Figure 9:
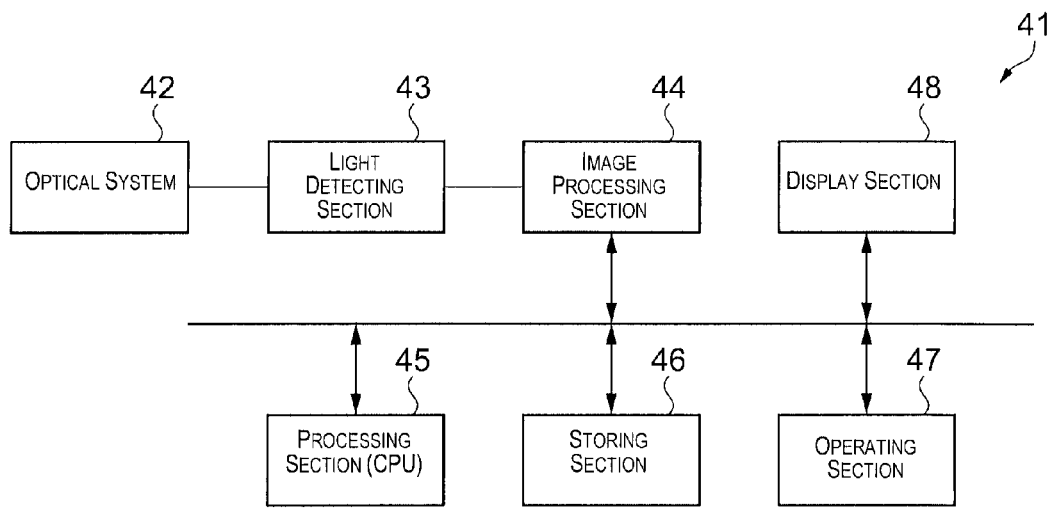
FIG. 9 is a block diagram showing a configuration of an infrared camera according to a third embodiment.

Next, an embodiment of an infrared camera that is one of the electronic devices provided with the infrared detecting element as its infrared detecting section will be explained with reference to a block diagram showing a configuration of the infrared camera of FIG. 9. As shown in FIG. 9, the infrared camera 41 as the electronic device includes an optical system 42, a light detecting section 43, an image processing section 44, a processing section 45, a storing section 46, an operating section 47, and a display section 48.

The optical system 42 includes, for example, a single or a plurality of lenses, and a driving section that drives the lens. The optical system 42 forms an image of an object onto the light detecting section 43. The optical system 42 can have a function of focus adjustment or stop adjustment as needed.

The light detecting section 43 uses a detector in which the infrared detecting elements 3 of the above embodiments are two-dimensionally aligned. In addition to the detector, the light detecting section 43 has a row selection circuit (row driver), a readout circuit that reads out data from the detector through column lines, an A/D converting section, and the like. By sequentially reading out data from the respective detectors that are two-dimensionally aligned, an image data of an object can be formed.

The image processing section 44 conducts various kinds of image processing such as image correction processing based on digital image data from the light detecting section 43. Image data is also referred to as pixel data.

The processing section 45 controls the entire infrared camera 41, and controls each block in the infrared camera 41. The processing section 45 can be implemented by, for example, a CPU and the like. The storing section 46 stores various kinds of information, and functions as a work area for the processing section 45 or the image processing section 44, for example. The operating section 47 serves as an interface, so that a user can operate the infrared camera 41. The operating section 56 can be implemented by, for example, various kinds of buttons or a GUI (Graphical User Interface) screen. The display section 48 displays images obtained by the light detecting section 43 or a GUI screen, for example. The display section 48 can be implemented by various kinds of displays such as a liquid crystal display or an organic EL display.

In this manner, thermal (optical) distribution images can be provided by using the light detecting section 43 in which the infrared detecting elements 3 are two-dimensionally aligned in two orthogonal directions. Electronic devices such as a thermography, an in-vehicle night vision, or a monitoring camera can be constructed by using the light detecting section 43.

Various kinds of electronic devices can be constructed by using one cell or a plurality of cells of the infrared detecting elements 3 as a sensor, and examples of such electronic devices include an analyzing device (measuring device) that analyzes (measures) physical information of an object, a security device that detects fire or heat generation, and an FA (Factory Automation) machine that is provided in a factory and the like.

As described above, the present embodiment has the following effect:

(1) According to the present embodiment, the infrared camera 41 has the light detecting section 43, and the infrared detecting element 3 is used in the light detecting section 43. The infrared detecting element 3 detects the amount of receiving infrared light with good sensitivity because the supporting section 23 does not stick to the recessed portion 15. Since the infrared detecting element 3 used in the light detecting section 43 can detect infrared rays with good sensitivity, the infrared camera 41 can serve as an electronic device provided with the infrared detecting element that can detect infrared rays with good sensitivity.

Fourth Embodiment

Figure 10:
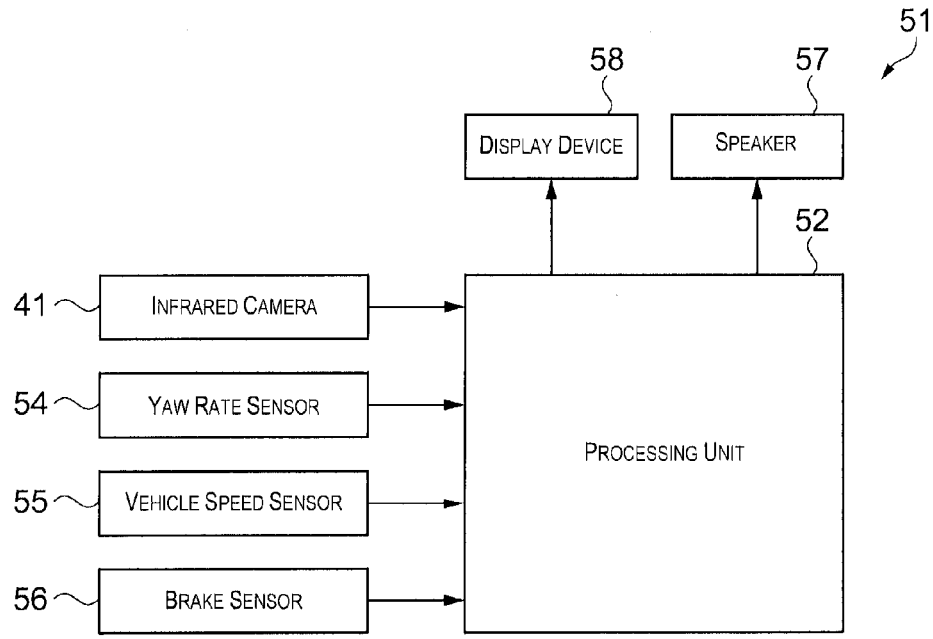
FIG. 10 is a block diagram showing a configuration of a driving support device according to a fourth embodiment.

Next, an embodiment of a driving support device that is one of the electronic devices using the infrared camera provided with the infrared detecting element in its infrared detecting section will be explained with reference to FIG. 10 and FIG. 11. FIG. 10 is a block diagram showing a configuration of the driving support device, and FIG. 11 is a schematic perspective view showing a vehicle in which the driving support device is installed.

As shown in FIG. 10, the driving support device 51 as the electronic device has a processing unit 52 provided with a CPU for controlling the driving support device 51, the infrared camera 41 that can detect infrared rays with respect to a predetermined imaging region outside the vehicle, and a yaw rate sensor 54 that detects the yaw rate of the vehicle. Further, the driving support device 51 has a vehicle speed sensor 55 that detects the running speed of the vehicle, a brake sensor 56 that detects whether or not the driver operates the brake, a speaker 57, and a display device 58. The infrared camera 41 in the present embodiment is the same camera as the infrared camera 41 in the above-described embodiment. The infrared camera 41 is provided with the infrared detecting element 3 in its infrared detecting section.

The processing unit 52 of the driving support device 51 uses infrared images of the vicinity of the vehicle obtained by taking images with the infrared camera 41, and detection signals with respect to the running state of the vehicle detected by the yaw rate sensor 54, the vehicle speed sensor 55, and the brake sensor 56, for example. The processing unit 52 detects an object such as a thing or a pedestrian that is present ahead in the running direction of the vehicle. When the processing unit 52 judges that the detected object and the vehicle are likely to collide, it causes the speaker 57 or the display device 58 to output an alarm.

Figure 11:
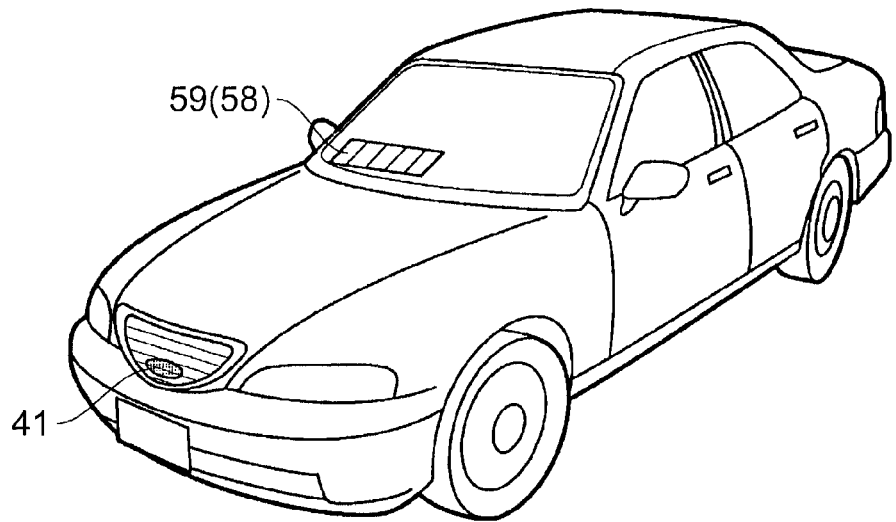
FIG. 11 is a schematic perspective view showing a vehicle in which the driving support device is installed.

As shown in FIG. 11, the infrared camera 41 is provided in the vicinity of the center of the front portion of the vehicle in the vehicle width direction. The display device 58 is configured to have an HUD (Head Up Device) 59 that displays various kinds of information in a position that does not hinder the driver's front vision in the front window.

As described above, the present embodiment has the following effect:

(1) According to the present embodiment, the driving support device 51 has the infrared camera 41. The infrared camera 41 has the light detecting section 43, and the infrared detecting element 3 is used in the light detecting section 43. The infrared detecting element 3 detects the amount of receiving infrared light with good sensitivity because the supporting section 23 does not stick to the recessed portion 15. Accordingly, the driving support device 51 can serve as an electronic device having the infrared camera 41 provided with the infrared detecting element 3 that can detect infrared rays with good sensitivity.

Fifth Embodiment

Figure 12:
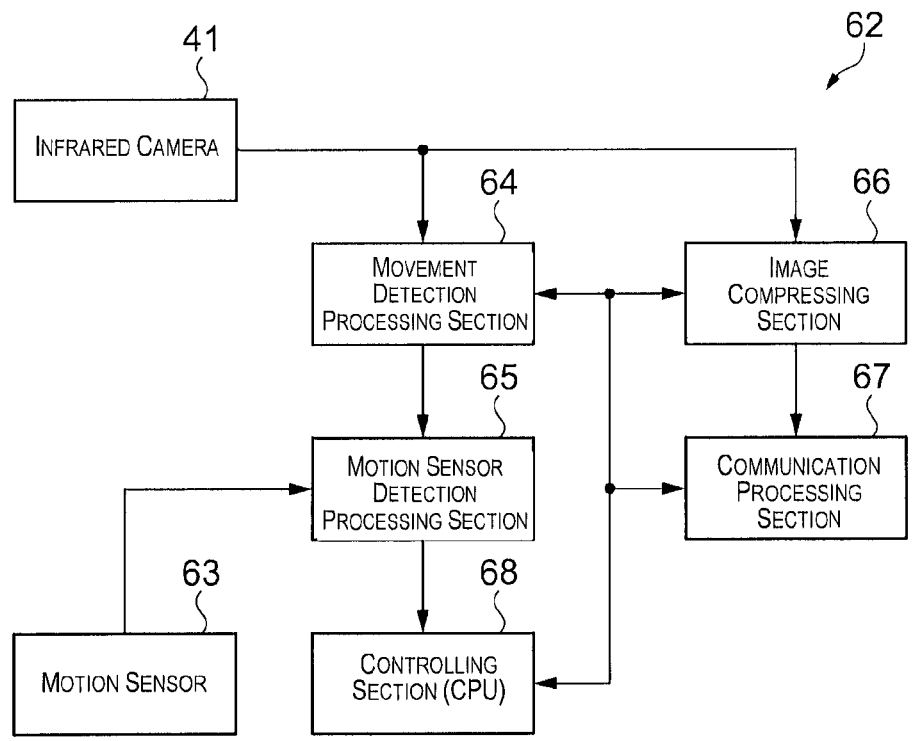
FIG. 12 is a block diagram showing a configuration of a security device according to a fifth embodiment.
Figure 13:
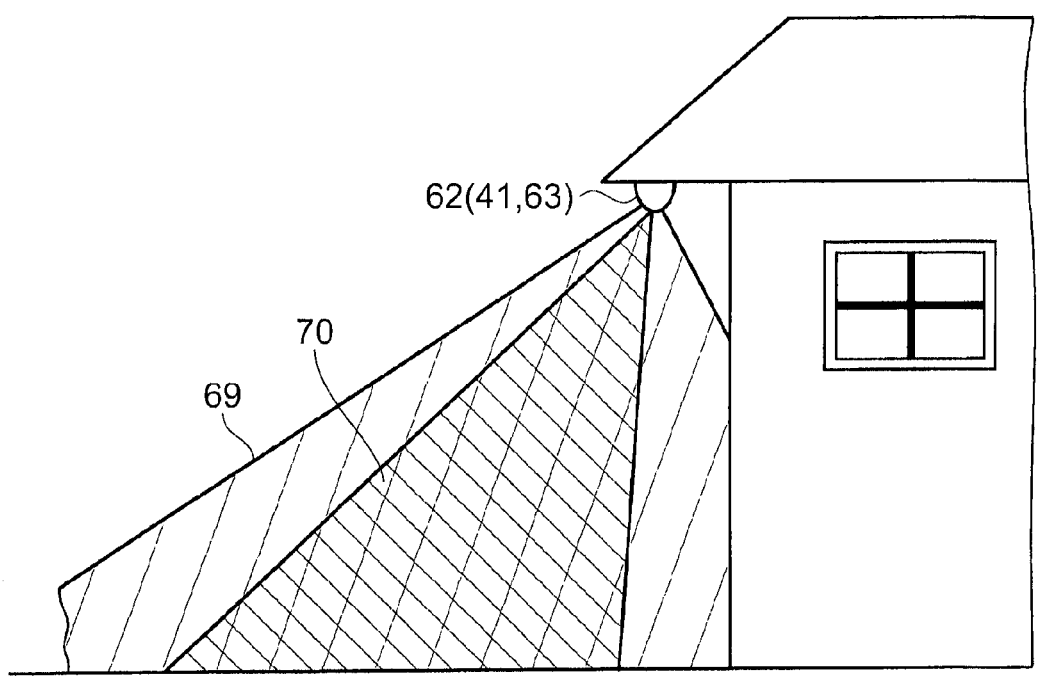
FIG. 13 is a diagram showing a house in which the security device is installed.

Next, an embodiment of a security device that is one of the electronic devices using the infrared camera provided with the infrared detecting element in its infrared detecting section will be explained with reference to FIG. 12 and FIG. 13. FIG. 12 is a block diagram showing a configuration of the security device, and FIG. 13 is a diagram showing a house in which the security device is installed.

As shown in FIG. 12, the security device 62 as the electronic device has the infrared camera 41 that takes images of a monitored area, and a motion sensor 63 that detects an intruder in the monitored area. The motion sensor 63 has the light detecting section, and the infrared detecting element 3 is used in the light detecting section. The infrared camera 41 in the present embodiment is the same camera as the infrared camera 41 in the above-described embodiment. The infrared camera 41 is provided with the infrared detecting element 3 in its infrared detecting section.

The security device 62 has a movement detection processing section 64 that detects a moving object that enters the monitored area by processing image data output from the infrared camera 41. Further, the security device 62 has a motion sensor detection processing section 65 that conducts detection processing of an intruder by using signals output from the motion sensor 63. Further, the security device 62 has an image compressing section 66, and the image compressing section 66 compresses image data output from the infrared camera 41 by a predetermined method. Further, the security device 62 has a communication processing section 67, and the communication processing section 67 transmits compressed image data or intruder detection information to external devices, and receives various kinds of setting information with respect to the security device 62 from external devices. Further, the security device 62 has a controlling section 68, the controlling section 68 conducts condition setting, processing command transmission, response processing to the respective processing section of the security device 62 by using a CPU (Central Processing Unit). The security device 62 is constructed of the above elements and the like. The infrared camera 41 in the present embodiment is the same camera as the infrared camera 41 in the above-described embodiment. The infrared camera 41 is provided with the infrared detecting element 3 in its infrared detecting section.

The movement detection processing section 64 has a buffer memory, a block data smoothing section to which the output signals of the buffer memory are input, and a state change detecting section to which the output signals of the block data smoothing section are input. These are not shown in the drawings. The state change detecting section compares frames that are images of taken moving images. If the monitored area is in rest state, different frames taken as moving image are the same image data. If change in state occurs due to entry of a moving object, difference occurs in the image data between frames. The state change detecting section detects change in state by using the difference in the image data between frames.

As shown in FIG. 13, regarding the security device 62, the infrared camera 41 and the motion sensor 63 are provided under the eaves. The infrared camera 41 detects an image-taking area 69, and the motion sensor 63 detects a detection area 70.

As described above, the present embodiment has the following effect:

(1) According to the present embodiment, the security device 62 has the motion sensor 63 and the infrared camera 41. The motion sensor 63 and the infrared camera 41 have the light detecting section, and the infrared detecting element 3 is used in the light detecting section. The infrared detecting element 3 detects the amount of receiving infrared light with good sensitivity because the supporting section 23 does not stick to the recessed portion 15. Accordingly, the security device 62 can serve as an electronic device provided with the motion sensor 63 and the infrared camera 41 having the infrared detecting element that can detect infrared rays with good sensitivity.

Sixth Embodiment

Figure 14:
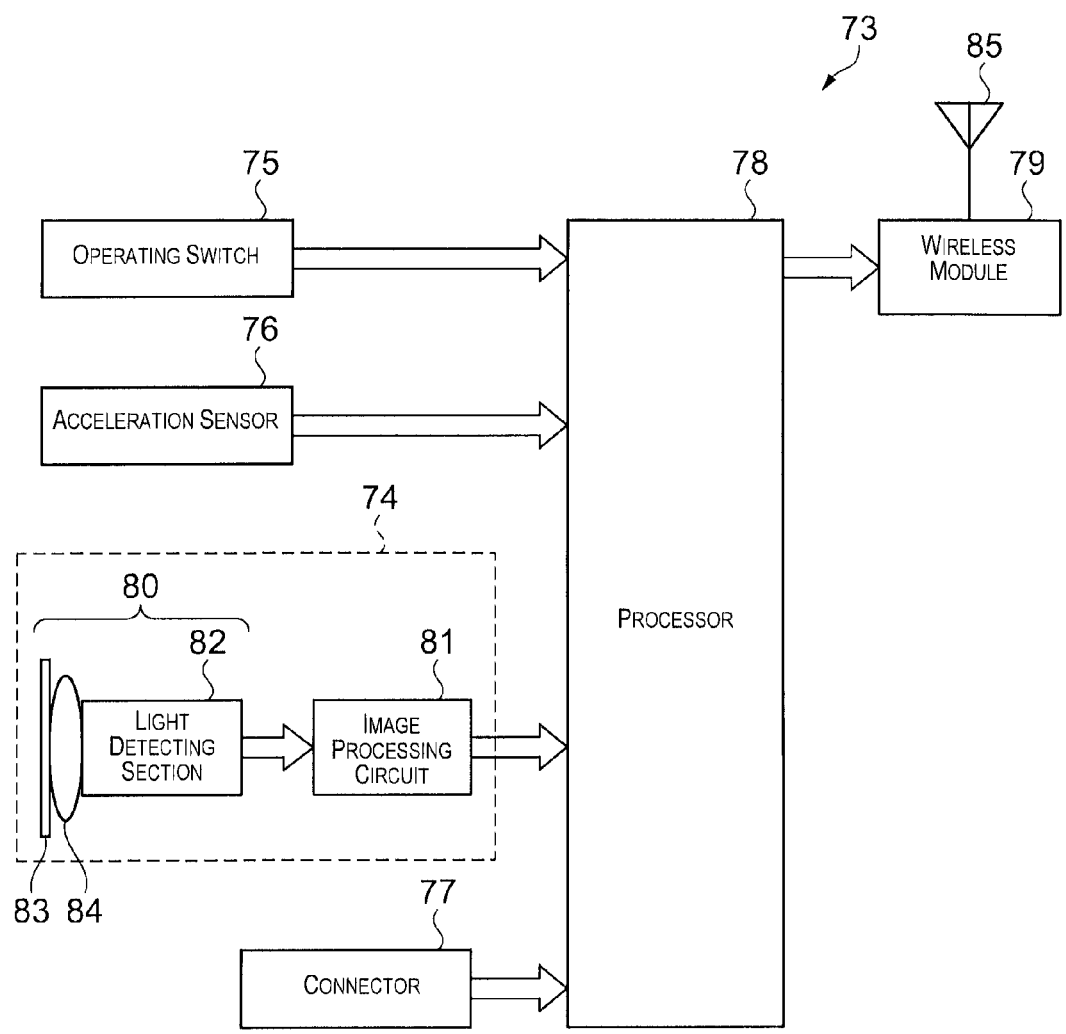
FIG. 14 is a block diagram showing a configuration of a controller for a game device according to a sixth embodiment.
Figure 15:
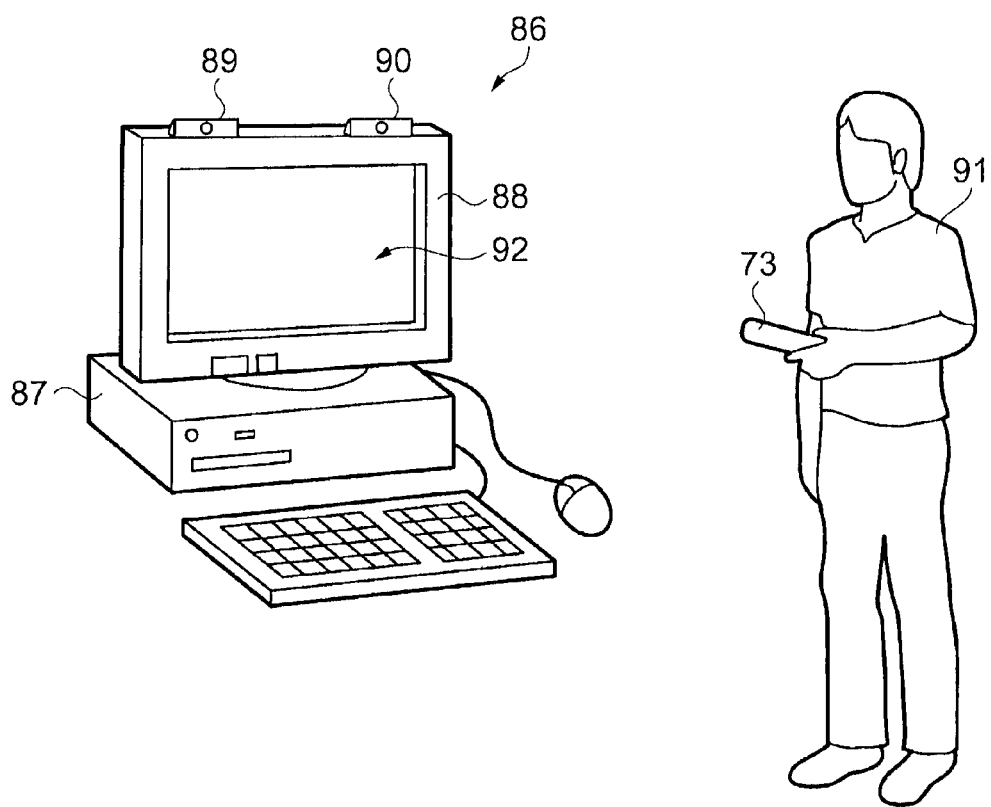
FIG. 15 is a diagram explaining how to use the controller.

Next, an embodiment of a game device that is one of the electronic devices using the infrared camera provided with the infrared detecting element in its infrared detecting section will be explained with reference to FIG. 14 and FIG. 15. FIG. 14 is a block diagram showing a configuration of a controller for the game device, and FIG. 15 is a diagram explaining how to use the controller.

As shown in FIG. 14, the controller 73 as the electronic device used for the game device has an imaging information computing unit 74, an operating switch 75, an acceleration sensor 76, a connector 77, a processor 78, and a wireless module 79.

The imaging information computing unit 74 has an imaging unit 80, and an image processing circuit 81 for processing data of an image taken by the imaging unit 80. The imaging unit 80 has a light detecting section 82, an infrared filter 83 that is connected to the light detecting section 82 and transmits only infrared rays, and an optical system 84 such as a lens. The image processing circuit 81 processes infrared image data obtained from the imaging unit 80, detects a bright portion, detects the gravity center or the area of the bright portion, and outputs data thereof. The infrared detecting element 3 of the above embodiments is used in the light detecting section 82.

The processor 78 outputs operation data from the operating switch 75 and acceleration data from the acceleration sensor 76 and bright portion data of infrared images to the wireless module 79 as a series of control data. The wireless module 79 modulates carrier waves having a predetermined frequency by this control data. The wireless module 79 has an antenna 85, and the carrier waves are output from the antenna 85 as radio signals.

Also, data input through the connector 77 provided in the controller 73 is processed by the processor 78 in the same manner as the above-described data, and output as control data from the wireless module 79 and the antenna 85.

As shown in FIG. 15, the game device 86 as the electronic device has the controller 73, a game device main body 87, a display 88, an LED module 89, and an LED module 90. A player 91 who operates the game device 86 can play a game by operating the controller 73 with one hand. When the imaging unit 80 of the controller 73 is turned to a screen 92 of the display 88, the imaging unit 80 detects infrared rays output from the LED module 89 and the LED module 90 provided in the vicinity of the display 88. The controller 73 obtains information on the position and the area of the LED module 89 and the LED module 90 as highly bright point information. Data on the position and the size of the bright point is transmitted from the controller 73 to the game device main body 87 wirelessly, and received by the game device main body 87. When the player 91 moves the controller 73, data on the position and the size of the bright point changes. Since the game device main body 87 can obtain operation signals corresponding to the movement of the controller 73 by using this, and the game device 86 can conduct the game accordingly.

As described above, the present embodiment has the following effect:

(1) According to the present embodiment, the controller 73 of the game device 86 has the light detecting section 82, and the infrared detecting element 3 is used in the light detecting section 82. The infrared detecting element 3 detects the amount of receiving infrared light with good sensitivity because the supporting section 23 does not stick to the recessed portion 15. Since the infrared detecting element 3 used in the light detecting section 82 can detect infrared rays with good sensitivity, the game device 86 can serve as an electronic device having the controller 73 provided with the infrared detecting element 3 that can detect infrared rays with good sensitivity.

Seventh Embodiment

Figure 16:
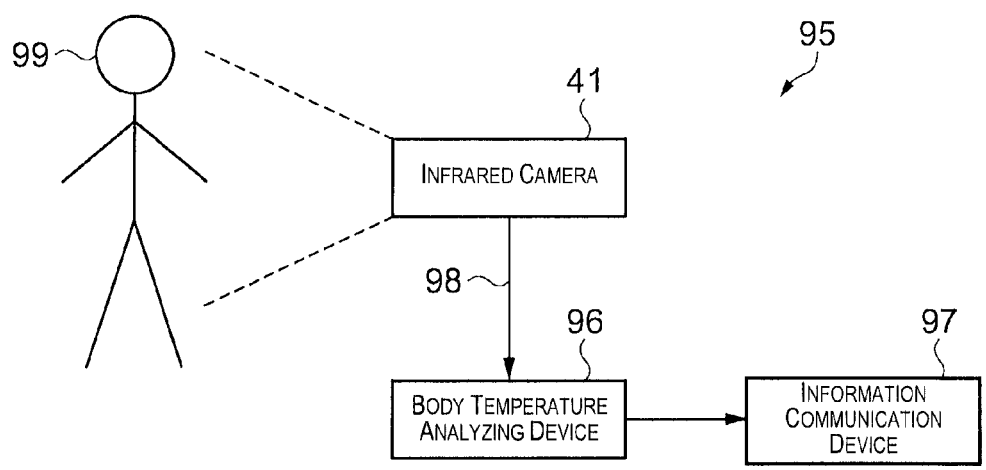
FIG. 16 is a block diagram showing a configuration of a body temperature measuring device according to a seventh embodiment.

Next, an embodiment of a body temperature measuring device that is one of the electronic devices using the infrared camera provided with the infrared detecting element in its infrared detecting section will be explained with reference to FIG. 16. FIG. 16 is a block diagram showing a configuration of the body temperature measuring device.

As shown in FIG. 16, the body temperature measuring device 95 as the electronic device has the infrared camera 41, a body temperature analyzing device 96, an information communication device 97, and a cable 98. The infrared camera 41 in the present embodiment is the same camera as the infrared camera 41 in the above embodiment.

The infrared camera 41 takes images of a predetermined object area, and transmits information on the taken image of an object person 99 to the body temperature analyzing device 96 through the cable 98. The body temperature analyzing device 96 has an image reading processing unit that reads a thermal distribution image from the infrared camera 41, and a body temperature analyzing processing unit that creates a body temperature analyzing table based on data from the image reading processing unit and an image analyzing setting table. The body temperature analyzing device 105 transmits body temperature information transmission data based on the body temperature analyzing table to the information communication device 97. The body temperature information transmission data can include predetermined data corresponding to abnormal body temperature. Also, when it is judged that there are a plurality of object persons 99 in the imaged area, the body temperature information transmission data can include the number of the object persons 99 and the number of persons who have an abnormal body temperature.

As described above, the present embodiment has the following effect:

(1) According to the present embodiment, the body temperature measuring device 95 has the infrared camera 41. The infrared camera 41 has the light detecting section, and the infrared detecting element 3 is used in the light detecting section. The infrared detecting element 3 detects the amount of receiving infrared light with good sensitivity because the supporting section 23 does not stick to the recessed portion 15. Accordingly, the body temperature measuring device 95 can serve as an electronic device provided with the infrared camera 41 having the infrared detecting element that can detect infrared rays with good sensitivity.

Eighth Embodiment

Figure 17:
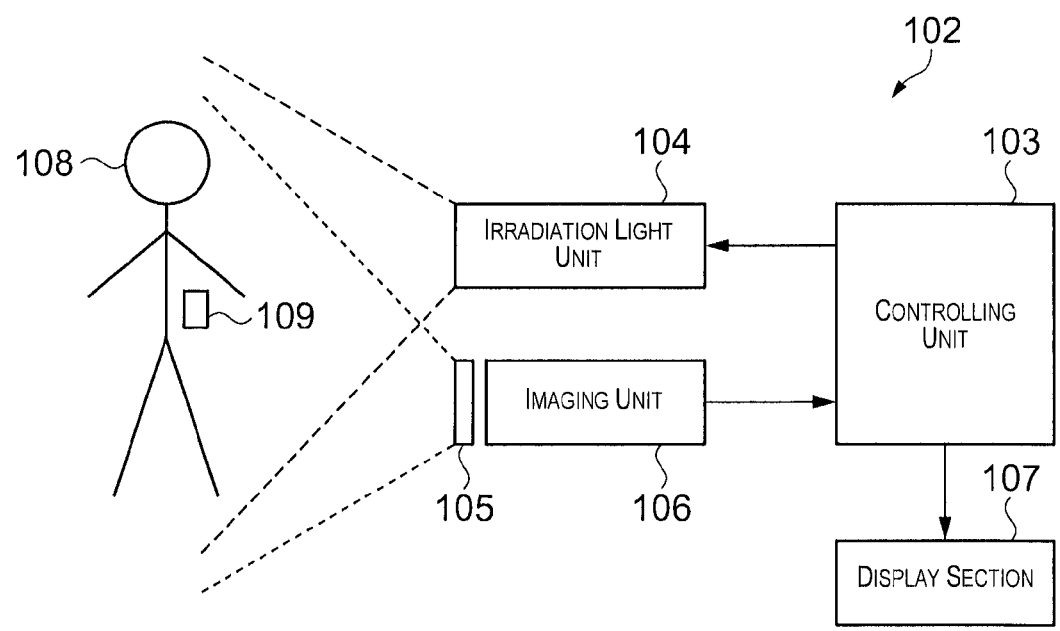
FIG. 17 is a block diagram showing a configuration of a specific substance detecting device according to an eighth embodiment.

Next, an embodiment of a specific substance detecting device that is one of the electronic devices provided with the infrared detecting element in its infrared detecting section will be explained with reference to FIG. 17. FIG. 17 is a block diagram showing a configuration of the specific substance detecting device.

As shown in FIG. 17, the specific substance detecting device 102 as the electronic device has a controlling unit 103, an irradiation light unit 104, an optical filter 105, an imaging unit 106, and a display section 107. The imaging unit 106 has an optical system such as a lens that is not shown in the drawing, and a light detecting section, and the light detecting section has the infrared detecting element 3 of the first embodiment. The absorbing wavelength of the infrared absorbing film 30 used in the infrared detecting section 4 of the infrared detecting element 3 is adjusted to be in a terahertz range.

The controlling unit 103 includes a system controller that controls the entire specific substance detecting device 102, and the system controller controls a light source driving section and an image processing unit that are included in the controlling unit. The irradiation light unit 104 includes a laser device and an optical system for emitting terahertz light that is electromagnetic waves having a wavelength within a range of 100 μm to 1000 μm, and an object person 108 to be measured is irradiated by the terahertz light.

The optical filter 105 is provided between the person 108 and the imaging unit 106. The optical filter 105 transmits only an optical spectrum of a specific substance 109 to be detected. The terahertz light reflected on the person 108 is separated by the optical filter 105, and only the optical spectrum of the specific substance 109 is received by the imaging unit 106. The image processing unit of the controlling unit 103 conducts predetermined image processing to image signals generated in the imaging unit 106, and the image signals are output to the display section 107. The presence of the specific substance 109 can be judged because the intensity of the received signal is different based on whether the specific substance 109 is present or not in the clothes and the like of the person 108.

As described above, the present embodiment has the following effect:

(1) According to the present embodiment, the specific substance detecting device 102 has the light detecting section in the imaging unit 106, and the infrared detecting element 3 of the above embodiments is used in the light detecting section. The infrared detecting element 3 detects the amount of receiving infrared light with good sensitivity because the supporting section 23 does not stick to the recessed portion 15. Since the infrared detecting element 3 used in the light detecting section can detect infrared rays with good sensitivity, the specific substance detecting device 102 can serve as an electronic device provided with the infrared detecting element 3 that can detect infrared rays with good sensitivity in the imaging unit 106.

Several embodiments are explained as above, but a person skilled in the art can easily understand that various modifications can be possible without substantially departing from the subject matter or the effect of the invention. Accordingly, these modifications are included in the scope of the invention. For example, a term described together with a different term having a broader or the same meaning in the specification or the drawings at least once can be replaced with the different term in any part of the specification or the drawings.

The invention can be widely applied to various pyroelectric detectors. The wavelength of detected light is not limited. Electronic devices having a pyroelectric detector or a pyroelectric detecting device, or those can be applied to a flow sensor and the like that detects a flow rate of a fluid under the conditions that a supplied heat amount and a heat amount the fluid deprives of are in equilibrium, for example. Instead of a thermocouple and the like provided in this flow sensor, the pyroelectric detector or the pyroelectric detecting device of the invention can be provided, and an object to be detected can be other than light.

The embodiment of the invention is not limited to the above-described embodiments, and various modifications and improvements can be possible. Modification examples will be described hereinafter.

Modification Example 1

In the first embodiment, the two beams 22 are provided, but the number of the beams 22 is not limited. The number of the beams 22 can be 1, or 3 or more. It is sufficient for the beam 22 to stably support the supporting section 23. Also, the beam 22 has a bent prism shape, but the shape of the beam 22 can be curved or straight. As long as the beam 22 stably supports the supporting section 23, any shape easy to design can be possible. Further, by making the beam 22 long, the heat amount transferred through the beam 22 can be reduced.

Modification Example 2

In the first embodiment, the drive circuit 9 is provided on the base plate 2, and the infrared detecting elements 3 are formed so as to be aligned on the same base plate 2. However, the drive circuit 9 can be provided on an external base plate instead of the base plate 2. Communication can be achieved between the base plate 2 and the external base plate by using a bump as a contact point. A sensor device is obtained by assembling the drive circuit 9 with good quality and a sensor array with good quality in which the infrared detecting elements 3 are aligned. Since the sensor device can be manufactured at a good yield ratio, the sensor device can be manufactured with good productivity.

Modification Example 3

In the first embodiment, the supporting section forming process of step S9 is conducted after the detecting section forming process of step S12. However, step S9 can be conducted between the supporting member forming process of step S5 and the penetrating electrode forming process of step S6. Alternatively, step S9 can be conducted between the penetrating electrode forming process of step S6 and the detecting section forming process of step S12. The order of the steps can be arranged such that manufacturing is facilitated.

Modification Example 4

In the first embodiment, the supporting member 20 is a film of SiN. However, a film of polysilicon can be provided on the supporting member 20 on the hollow space 17 side. It is thus possible to improve the water repellent properties with respect to pure water in an area that contacts the hollow space 17. Since the pure water is easily discharged from the hollow space 17, it is possible to further prevent the supporting section 23 from sticking to the bottom of the recessed portion 15.

Modification Example 5

In the first embodiment, the water repellent film 16 is formed in the water repellent film forming process of step S3. Subsequently, patterning is conducted to the water repellent film 16. The patterning to the water repellent film 16 can be conducted in a process of flattening the upper surface of the sacrifice film 32 by using a CMP method during the sacrifice film forming process of step S4. The patterning to the water repellent film 16 is for removing the water repellent film 16 in an area other than the recessed portion 15, and the patterning can be conducted by flattening the upper surface of the sacrifice film 32. By using this method, a process for forming a mask and a process for conducting a dry etching process can be omitted. As a result, the infrared detecting element 3 can be manufactured with good productivity.

Modification Example 6

In the first embodiment, the infrared absorbing film forming process of step S10 is conducted after the supporting section forming process of step S9. However, step S9 can be conducted after step S10. Specifically, the patterning for forming the shape of the beam 22 and the supporting section 23 can be conducted after the infrared absorbing film 30 is formed in the infrared detecting section 4. The order of the processes can be arranged such that manufacturing is facilitated.

Modification Example 7

In the first embodiment, cleaning is conducted with pure water and drying is conducted in the etching process of step S11. After cleaning is conducted with pure water, water displacement can be conducted with a liquid having a low boiling point such as alcohol. Since the liquid is quickly discharged from the recessed portion 15, it is possible to further prevent the supporting section 23 from sticking to the bottom of the recessed portion 15.

Modification Example 8

In the first embodiment, the base plate 2 is immersed in an etching solution of hydrogen fluoride in the etching process of S11. However, it can be possible to use buffered hydrofluoric acid obtained by combining hydrofluoric acid and ammonium acid.

What is claimed is:

1. An infrared detecting element comprising:
   a base plate;
   an insulating film that is provided on the base plate and has a recessed portion;
   a supporting section that is held by a beam, one end of the beam being fixed to the base plate, and is located above the recessed portion such that a hollow space stands between the supporting section and the recessed portion; and
   an infrared detecting section that is provided on the supporting section and detects infrared rays,
   wherein the recessed portion is covered with a water repellent film that includes polysilicon, and the beam and the supporting section include silicon nitride or silicon carbonitride.

2. The infrared detecting element according to claim 1, wherein the infrared detecting section has a lower electrode, a pyroelectric body, and an upper electrode that are provided and layered on the supporting section; the supporting section includes silicon nitride; and the pyroelectric body has a preferred orientation.

3. An electronic device having a light detecting section that detects infrared rays,
   wherein the light detecting section has the infrared detecting element according to claim 1.

4. A method for manufacturing an infrared detecting element comprising:
   an insulating film forming process for forming an insulating film on a base plate;
   a recessed portion forming process for forming a recessed portion in the insulating film;
   a water repellent film forming process for forming a water repellent film so as to cover the recessed portion;
   a sacrifice film forming process for forming a sacrifice film on the recessed portion;
   a supporting member forming process for film-forming a supporting member on the sacrifice film;
   a detecting section forming process for forming an infrared detecting section on the supporting member;
   a supporting section forming process for patterning the supporting member into shapes of a supporting section that supports the infrared detecting section and a beam that holds the supporting section; and
   an etching process for conducting etching to the sacrifice film,
   wherein the water repellent film includes polysilicon, and the supporting member includes silicon nitride or silicon carbonitride.

5. The method for manufacturing the infrared detecting element according to claim 4, wherein
   part of the water repellent film is exposed in the sacrifice film forming process; and
   etching is conducted to an exposed surface of the water repellent film and the supporting member is provided so as to overlap the water repellent film in the supporting member forming process.

* * * * *